(12) United States Patent
Lee et al.

(10) Patent No.: US 11,466,043 B2
(45) Date of Patent: Oct. 11, 2022

(54) NIOBIUM COMPOUND AND METHOD OF FORMING THIN FILM

(71) Applicant: SAMSUNG ELECTRONICS CO., LTD., Suwon-si (KR)

(72) Inventors: Soyoung Lee, Suwon-si (KR); Seungmin Ryu, Hwaseong-si (KR); Gyuhee Park, Hwaseong-si (KR); Jaesoon Lim, Seoul (KR); Younjoung Cho, Hwaseong-si (KR); Akio Saito, Tokyo (JP); Wakana Fuse, Tokyo (JP); Yutaro Aoki, Tokyo (JP); Takanori Koide, Tokyo (JP)

(73) Assignees: SAMSUNG ELECTRONICS CO., LTD., Suwon-si (KR); ADEKA CORPORATION, Tokyo (JP)

( * ) Notice: Subject to any disclaimer, the term of this patent is extended or adjusted under 35 U.S.C. 154(b) by 215 days.

(21) Appl. No.: 16/881,283

(22) Filed: May 22, 2020

(65) Prior Publication Data

US 2021/0040130 A1 Feb. 11, 2021

(30) Foreign Application Priority Data

Aug. 6, 2019 (KR) .................. 10-2019-0095746

(51) Int. Cl.
*C07F 17/00* (2006.01)
*C09D 1/00* (2006.01)
*C01B 21/06* (2006.01)
*H01L 21/28* (2006.01)
*H01L 49/02* (2006.01)
*H01L 21/285* (2006.01)

(52) U.S. Cl.
CPC .......... *C07F 17/00* (2013.01); *C01B 21/0617* (2013.01); *C09D 1/00* (2013.01); *C01P 2006/40* (2013.01); *H01L 21/28088* (2013.01); *H01L 21/28568* (2013.01); *H01L 28/60* (2013.01)

(58) Field of Classification Search
CPC ..... C01G 33/00; C07F 17/00; C01B 21/0617; C09D 1/00; C01P 2006/40; H01L 21/28088; H01L 21/28568; H01L 28/60
See application file for complete search history.

(56) References Cited

U.S. PATENT DOCUMENTS

| 5,502,124 | A | * | 3/1996 | Crowther | ................ C08F 10/02 |
| | | | | | 526/170 |
| 5,679,815 | A | | 10/1997 | Kirlin | |
| 5,998,657 | A | | 12/1999 | Gogate et al. | |
| 6,114,270 | A | * | 9/2000 | Krishnamurti | ....... B01J 31/1805 |
| | | | | | 502/103 |
| 7,667,038 | B2 | | 2/2010 | Reuter et al. | |
| 8,460,989 | B2 | | 6/2013 | Blasco et al. | |
| 9,353,449 | B2 | | 5/2016 | Nomura et al. | |
| 10,259,836 | B2 | | 4/2019 | Lim et al. | |
| 2008/0038466 | A1 | | 2/2008 | Reuter et al. | |
| 2010/0010248 | A1 | * | 1/2010 | Tada | ..................... C23C 16/405 |
| | | | | | 556/42 |
| 2017/0152144 | A1 | | 6/2017 | Lansalot-Matras et al. | |
| 2021/0388010 | A1 | * | 12/2021 | Ryu | ..................... C23C 16/405 |

FOREIGN PATENT DOCUMENTS

| JP | 2004353024 A | 12/2004 | |
| JP | 5746034 B2 | 7/2015 | |
| JP | 5954714 B2 | 7/2016 | |
| KR | 10-1602984 B1 | 3/2016 | |
| WO | WO-2015072589 A1 * | 5/2015 | ............ C01G 33/00 |

OTHER PUBLICATIONS

CAS/CAPLUS Abstract and indexed Compounds, M. Jolly et al., Journal of the Chemical Society, Dalton Transactions: Inorganic Chemistry, 1331-1332 (1992) (Year: 1992).*
CAS/CAPLUS Abstract and indexed Compound, S. Schmidt et al., 472 Journal of Organometallic Chemistry, 127-138 (1994) (Year: 1994).*
CAS/CAPLUS Abstract and Indexed Compound, R. Krishnamurti, et al., U.S. Pat. No. 6,114,270 (2000) (Year: 2000).*
S. Schmidt et al., 472 Journal of Organometallic Chemistry, 127-138 (1994) (Year: 1994).*
M. Jolly et al., Journal of the Chemical Society, Dalton Transactions: Inorganic Chemistry, 1331-1332 (1992) (Year: 1992).*
D. Williams et al., Journal of the Chemical Society, Dalton Transactions: Inorganic Chemistry, 739-751 (1992) (Year: 1992).*
A. Antinolo et al., 17 Organometallics, 5874-5879 (1998) (Year: 1998).*

(Continued)

*Primary Examiner* — Alexander R Pagano
(74) *Attorney, Agent, or Firm* — Lee IP Law, P.C.

(57) ABSTRACT

A niobium compound and a method of forming a thin film using the niobium compound, the compound being represented by the following General formula I:

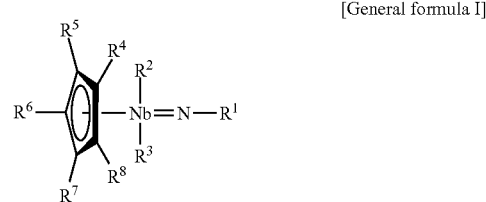

[General formula I]

wherein, in General formula I, $R^1$, $R^4$, $R^5$, $R^6$, $R^7$, and $R^8$ are each independently a hydrogen atom, a C1-C6 linear or branched alkyl group or a C3-C6 cyclic hydrocarbon group, at least one of $R^4$, $R^5$, $R^6$, $R^7$, and $R^8$ being a C1-C6 linear or branched alkyl group, and $R^2$ and $R^3$ are each independently a hydrogen atom, a halogen atom, a C1-C6 linear or branched alkyl group, or a C3-C6 cyclic hydrocarbon group.

17 Claims, 25 Drawing Sheets

(56) References Cited

OTHER PUBLICATIONS

M. Chan et al., Journal of the Chemical Society, Dalton Transactions: Inorganic Chemistry, 103-111 (1998) (Year: 1998).*
V. Gibson et al., Journal of the Chemical Society, Dalton Transactions: Inorganic Chemistry, 4457-4465 (2003) (Year: 2003).*

* cited by examiner

NIOBIUM COMPOUND AND METHOD OF FORMING THIN FILM

CROSS-REFERENCE TO RELATED APPLICATION

Korean Patent Application No. 10-2019-0095746, filed on Aug. 6, 2019, in the Korean Intellectual Property Office, and entitled: "Niobium Compound and Method of Forming Thin Film," is incorporated by reference herein in its entirety.

BACKGROUND

1. Field

Embodiments relate to a niobium compound and a method of forming a thin film using the same.

2. Description of the Related Art

With the development of electronic technology, semiconductor devices have rapidly been downscaled, and patterns constituting electronic devices have been miniaturized.

SUMMARY

The embodiments may be realized by providing a niobium compound represented by the following General formula I:

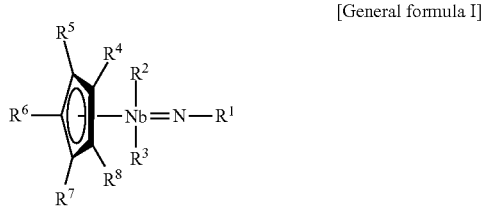

[General formula I]

wherein, in General formula I, $R^1$, $R^4$, $R^5$, $R^6$, $R^7$, and $R^8$ are each independently a hydrogen atom, a C1-C6 linear or branched alkyl group or a C3-C6 cyclic hydrocarbon group, at least one of $R^4$, $R^5$, $R^6$, $R^7$, and $R^8$ being a C1-C6 linear or branched alkyl group, and $R^2$ and $R^3$ are each independently a hydrogen atom, a halogen atom, a C1-C6 linear or branched alkyl group, or a C3-C6 cyclic hydrocarbon group.

The embodiments may be realized by providing a niobium compound represented by General formula I, above, wherein, in General formula I, $R^1$ is a C1-C6 linear or branched alkyl group or a C3-C6 cyclic hydrocarbon group, $R^4$, $R^5$, $R^6$, $R^7$, and $R^8$ are each independently a hydrogen atom, a C1-C6 linear or branched alkyl group, or a C3-C6 cyclic hydrocarbon group, $R^2$ and $R^3$ are each independently a hydrogen atom, a halogen atom, a C1-C6 linear or branched alkyl group, or a C3-C6 cyclic hydrocarbon group, and when all of $R^4$, $R^5$, $R^6$, $R^7$, and $R^8$ are methyl groups, $R^2$ and $R^3$ are each independently a hydrogen atom, a C1-C6 linear or branched alkyl group, or a C3-C6 cyclic hydrocarbon group.

The embodiments may be realized by providing a niobium compound represented by the following General formula II:

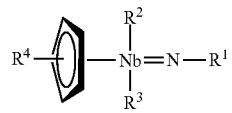

[General formula II]

wherein, in General formula II, $R^1$ and $R^4$ are each independently a C1-C6 linear or branched alkyl group, and $R^2$ and $R^3$ are each independently a halogen atom or a C1-C6 linear or branched alkyl group.

The embodiments may be realized by providing a method of forming a thin film, the method comprising forming a niobium-containing film on a substrate by supplying a niobium compound onto the substrate, wherein the niobium compound is represented by General formula I, above, wherein, in General formula I, $R^1$, $R^4$, $R^5$, $R^6$, $R^7$, and $R^8$ are each independently a hydrogen atom, a C1-C6 linear or branched alkyl group or a C3-C6 cyclic hydrocarbon group, at least one of $R^4$, $R^5$, $R^6$, $R^7$, and $R^8$ being a C1-C6 linear or branched alkyl group, and $R^2$ and $R^3$ are each independently a hydrogen atom, a halogen atom, a C1-C6 linear or branched alkyl group, or a C3-C6 cyclic hydrocarbon group.

BRIEF DESCRIPTION OF THE DRAWINGS

Features will be apparent to those of skill in the art by describing in detail exemplary embodiments with reference to the attached drawings in which:

FIGS. 6A to 6C illustrate stages in a method of manufacturing an IC device according to embodiments, in which FIG. 6A is a plan view of the IC device to be formed, FIG. 6B is a perspective view of the IC device of FIG. 6A, and FIG. 6C is a cross-sectional view of sectional configurations taken along lines X-X' and Y-Y' of FIG. 6A.

DETAILED DESCRIPTION

Figure 1:
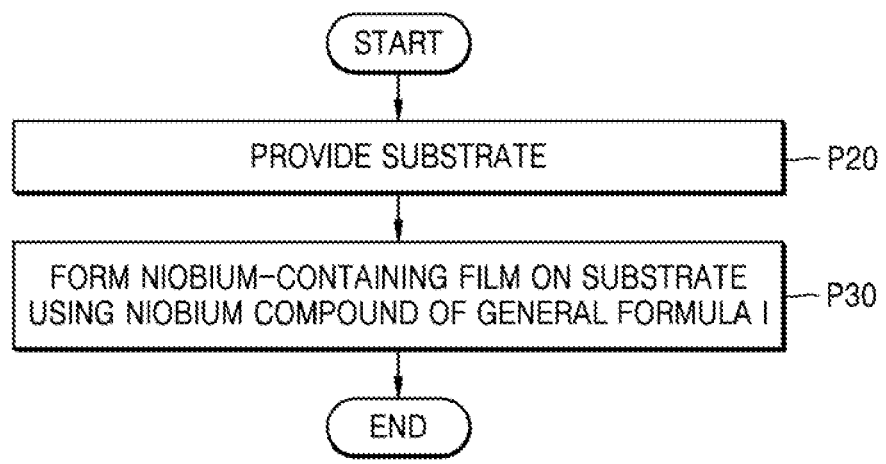
FIG. 1 illustrates a flowchart of a method of forming a thin film, according to embodiments.

When an expression "a surface of a substrate" is used herein, it should be understood as either as an exposed surface of the substrate itself or an outer surface of a predetermined layer or film formed on the substrate. As used herein, an abbreviation "Me" refers to a methyl group, an abbreviation "Et" refers to an ethyl group, an abbreviation "Pr" refers to a propyl group, an abbreviation "nPr" refers to a normal propyl group or a linear propyl group, an abbreviation "iPr" refers to an isopropyl group, an abbreviation "Bu" refers to a butyl group, an abbreviation "nBu" refers to a normal butyl group or a linear butyl group, an abbreviation "tBu" refers to a tert-butyl group (or a 1,1-dimethylethyl group); an abbreviation "sBu" refers to a sec-butyl group (or a 1-methylpropyl group), an abbreviation "iBu" refers to an iso-butyl group (or a 2-methylpropyl group), an "amyl" refers to a pentyl group, and a "tert-amyl group" refers to a tert-pentyl group (or a 1,1-dimethylpropyl group). As used herein, the term "room temperature" or "ambient temperature" refers to a temperature ranging from about 20° C. to about 28° C.

A niobium compound according to an embodiment may be represented by the following General formula I:

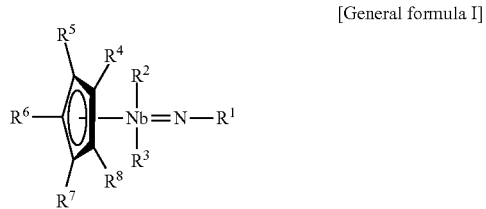

[General formula I]

In General formula I, $R^1$, $R^4$, $R^5$, $R^6$, $R^7$, and $R^8$ may independently be, e.g., a hydrogen atom, a C1-C6 linear or branched alkyl group (e.g., a C1-C6 linear alkyl group or a C3-C6 branched alkyl group), or a C3-C6 cyclic hydrocarbon group. $R^2$ and $R^3$ may independently be, e.g., a hydrogen atom, a halogen atom or element, a C1-C6 linear or branched alkyl group, or a C3-C6 cyclic hydrocarbon group. In an implementation, at least one of $R^4$, $R^5$, $R^6$, $R^7$, and $R^8$ may be, e.g., a C1-C6 linear or branched alkyl group. As used herein, the term "or" is not an exclusive term, e.g., "A or B" would include A, B, or A and B. In General formula I, the illustrated ring is a cyclopentadienyl ring.

The halogen atom may be, e.g., fluorine (F), chlorine (Cl), bromine (Br), or iodine (I).

In an implementation, one of $R^4$, $R^5$, $R^6$, $R^7$, and $R^8$ may be, e.g., a C1-C3 linear or branched alkyl group, and remaining ones (e.g., the other four) of $R^4$, $R^5$, $R^6$, $R^7$, and $R^8$ may be hydrogen atoms.

In an implementation, at least one of $R^4$, $R^5$, $R^6$, $R^7$, and $R^8$ may be, e.g., a hydrogen atom. In an implementation, when each of $R^4$, $R^5$, $R^6$, $R^7$, and $R^8$ is a methyl group, $R^2$ and $R^3$ may each independently be, e.g., a hydrogen atom, a C1-C6 linear or branched alkyl group, or a C3-C6 cyclic hydrocarbon group. In an implementation, $R^1$ may be, e.g., a C1-C5 linear or branched alkyl group. In an implementation, $R^1$ may be, e.g., a methyl group, an ethyl group, a propyl group, an isopropyl group, a butyl group, an isobutyl group, a sec-butyl group, a tert-butyl group, a pentyl group, an isopentyl group, a neopentyl group, or a tert-pentyl group. In an implementation, at least one of $R^2$ and $R^3$ may be, e.g., a halogen atom. In an implementation, at least one of $R^2$ and $R^3$ may be, e.g., a C1-C3 linear alkyl group or a C3 branched alkyl group. In an implementation, a niobium compound according to an embodiment may be a liquid at room or ambient temperature, e.g., which may vary depending on a season. For example, the niobium compound may be a liquid at a temperature range of about 20° C. to about 28° C.

In an implementation, the niobium compound may be represented by the following General formula II.

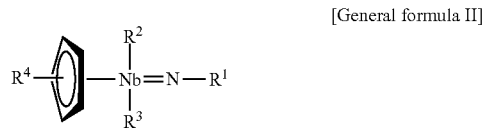

[General formula II]

In General formula II, $R^1$ and $R^4$ may each independently be, e.g., a C1-C6 linear or branched alkyl group, and each of $R^2$ and $R^3$ may each independently be, e.g., a halogen atom or a C1-C6 linear or branched alkyl group.

In an implementation, in General formula II, $R^1$ may be, e.g., a C3-C5 branched alkyl group. In an implementation, in General formula II, $R^2$ and $R^3$ may each independently be, a halogen atom. In some other embodiments, in General formula II, $R^2$ and $R^3$ may each independently be, a C1-C3 linear alkyl group or a C3 branched alkyl group. In an implementation, in General formula II, $R^4$ may be, e.g., a C1-C3 linear alkyl group or a C3 branched alkyl group. In an implementation, in General formula II, $R^1$, $R^2$, $R^3$, and $R^4$ may each independently be, e.g., a methyl group, an ethyl group, a propyl group, an isopropyl group, a butyl group, an isobutyl group, a sec-butyl group, a tert-butyl group, a pentyl group, an isopentyl group, a neopentyl group, or a tert-pentyl group. In an implementation, in General formula II, $R^1$ may be, e.g., a branched pentyl group, $R^2$ and $R^3$ may each independently be, e.g., a chlorine atom, a C1-C3 linear alkyl group, or a C3 branched alkyl group, and $R^4$ may be, e.g., a C1-C3 linear alkyl group or a C3 branched alkyl group.

In the niobium compound of General formula II, each of $R^1$, $R^2$, $R^3$, and $R^4$ may contribute to increasing a vapor pressure of the niobium compound, lowering a melting point of the niobium compound, and improving the stability of the niobium compound in a thin-film manufacturing process including a process of vaporizing the niobium compound of General formula II.

In an implementation, in the niobium compound of General formula II, when $R^1$ is a C3-C5 alkyl group, the melting point of the niobium compound of General formula II may be lowered. For example, when $R^1$ is a tert-alkyl group, the melting point of the niobium compound of General formula II may be further lowered. For example, when $R^1$ is an amyl group, the melting point of the niobium compound of General formula II may be greatly lowered.

In an implementation, in the niobium compound of General formula II, when each of $R^2$ and $R^3$ is a chlorine atom or a C1-C3 alkyl group, a vapor pressure of the niobium compound of General formula II may be increased. In an implementation, when $R^2$ and $R^3$ are chlorine atoms, the vapor pressure of the niobium compound of General formula II may be increased due to relatively high bonding energy between a niobium atom and a chlorine atom. When the vapor pressure of the niobium compound is increased, the supply stability of the niobium compound may be improved during the delivery of the niobium compound to be used in a deposition process.

In an implementation, in the niobium compound of General formula II, unlike a case in which $R^4$ is a hydrogen atom, when $R^4$ is a C1-C3 alkyl group, the stericity of a cyclopentadienyl group may be increased. For example, intermolecular attraction may become relatively weak and the niobium compound may be easily liquefied. As a result, a melting point of the niobium compound of General formula II may be lowered. In an implementation, when $R^4$ is a methyl group or an ethyl group, the melting point of the niobium compound of General formula II may be further lowered.

When a thin film is formed using the niobium compound of General formula II by a metal organic deposition (MOD) process, which does not involve a vaporization process, each of $R^1$, $R^2$, $R^3$, and $R^4$ may be selected based on solubility in a used solvent and a thin-film formation reaction.

In an implementation, the niobium compound may be, e.g., a compound of one of Formulae 1 to 36.

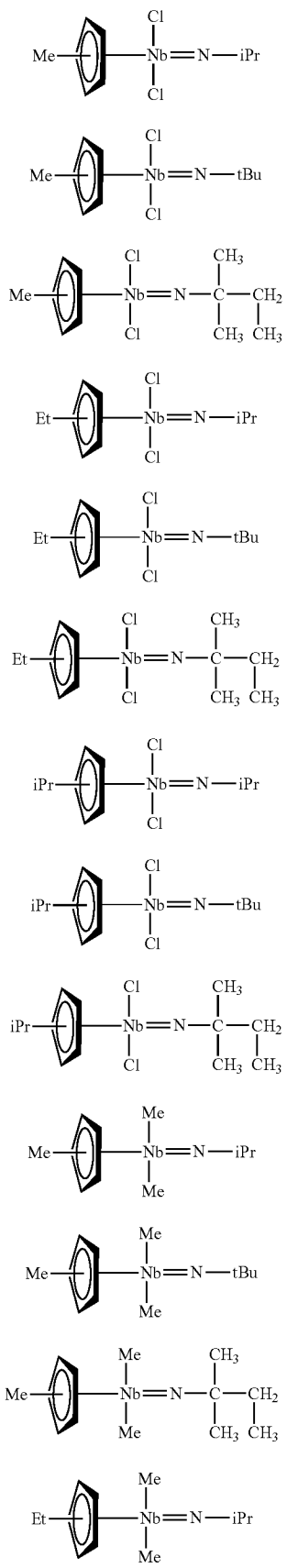
[Formula 1]
[Formula 2]
[Formula 3]
[Formula 4]
[Formula 5]
[Formula 6]
[Formula 7]
[Formula 8]
[Formula 9]
[Formula 10]
[Formula 11]
[Formula 12]
[Formula 13]
-continued
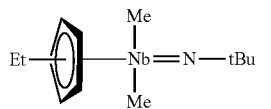
[Formula 14]
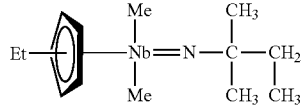
[Formula 15]
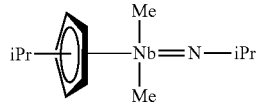
[Formula 16]
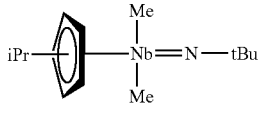
[Formula 17]
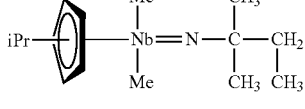
[Formula 18]
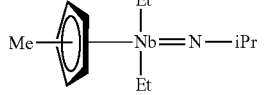
[Formula 19]
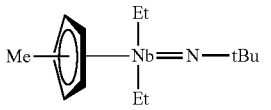
[Formula 20]
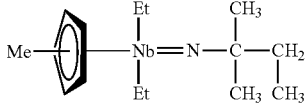
[Formula 21]
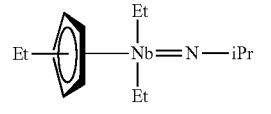
[Formula 22]
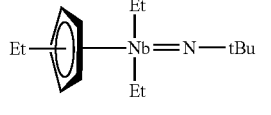
[Formula 23]
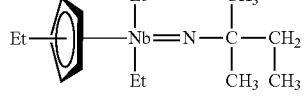
[Formula 24]
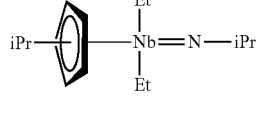
[Formula 25]
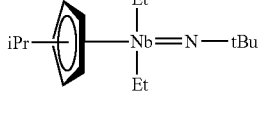
[Formula 26]

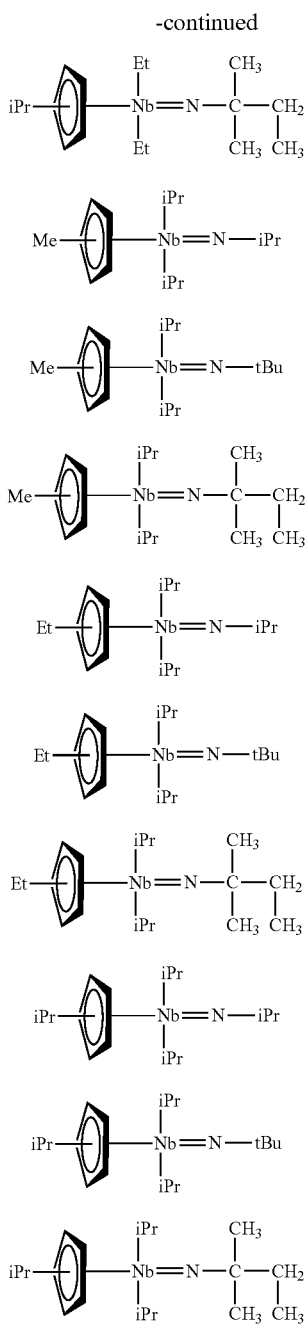

[Formula 27]

[Formula 28]

[Formula 29]

[Formula 30]

[Formula 31]

[Formula 32]

[Formula 33]

[Formula 34]

[Formula 35]

[Formula 36]

In an implementation, the niobium compound according to the embodiment may be a liquid at ambient temperature. For example, of the compounds of Formulae 1 to 36, at least the compound of Formula 3 and the compound of Formula 6 may be liquids at ambient temperature.

A method of preparing the niobium compound, according to the embodiment, may include a suitable reaction. For example, the preparation of the niobium compound according to the embodiment may include causing a reaction of chloro trimethylsilane with sodium hydride and alkyl cyclopentadiene, causing a reaction of the obtained resultant product with niobium chloride, causing a reaction of alkyl amine having a structure corresponding to a compound structure to be formed, and distilling and purifying the obtained reaction product.

A niobium compound according to an embodiment may have a relatively low melting point and be capable of being delivered in a liquid phase. Also, the niobium compound according to the embodiment may have a relatively high vapor pressure, and the niobium compound may be easily vaporized and delivered. For example, the niobium compound according to the embodiment may be appropriately used as a source compound for forming a niobium-containing film during a deposition process (e.g., a chemical vapor deposition (CVD) process or an atomic layer deposition (ALD) process) in which a source compound required for forming a thin film is supplied in a vaporized state. The niobium compound according to the embodiment may be easily delivered to a structure having a relatively high aspect ratio due to the relatively high vapor pressure thereof. For example, a niobium-containing film having good step coverage characteristics and good gap-fill characteristics may be formed on the structure having the relatively high aspect ratio.

The niobium compound according to the embodiment may react with a reactive gas at a relatively low temperature. For example, in a process of forming a niobium-containing film using the niobium compound according to the embodiment, it may not be necessary to heat the niobium compound to cause a reaction of the niobium compound with the reactive gas, thereby improving the productivity of a thin-film forming process.

Hereinafter, a method of forming a thin film, according to embodiments, will be described in detail.

FIG. 1 illustrates a flowchart of a method of forming a thin film, according to embodiments. Referring to FIG. 1, a substrate may be provided in process P20.

In an implementation, the substrate may include, e.g., a semiconductor element, such as silicon (Si) or germanium (Ge), or a compound semiconductor, such as silicon carbide (SiC), gallium arsenide (GaAs), indium arsenide (InAs), or indium phosphide (InP). In an implementation, the substrate may include a semiconductor substrate, at least one insulating film formed on the semiconductor substrate, or structures including at least one conductive region. The conductive region may include, e.g., a doped well or a doped structure. In an implementation, the substrate may have various device isolation structures, e.g., a shallow trench isolation (STI) structure.

In process P30 of FIG. 1, a niobium-containing film may be formed on the substrate using the niobium compound of General formula I.

To form the niobium-containing film, vapor containing the vaporized niobium compound of General formula I may be decomposed, deposited, or chemically reacted on the substrate.

In an implementation, to form the niobium-containing film, the vaporized niobium compound of General formula I may be solely supplied (e.g., by itself) on the substrate. In an implementation, to form the niobium-containing film, the vaporized niobium compound of General formula I and, e.g., another precursor, a reactive gas, a carrier gas, or a purge gas may be simultaneously or sequentially supplied on the substrate. Detailed configurations of the other precursor, the reactive gas, the carrier gas, and the purge gas will be described below. In an implementation, the niobium-containing film may include, e.g., a niobium film, a niobium oxide film, a niobium nitride film, a niobium silicide film, or a combination thereof. In an implementation, the niobium oxide film may include, e.g., NbO, $NbO_2$, or $Nb_2O_5$. In an implementation, the niobium nitride film may include, e.g., niobium nitride (NbN). In an implementation, any suitable kind of a niobium-containing film may be formed by using a method of forming a thin film, according to embodiments.

FIGS. 2A to 2D illustrate deposition systems 200A, 200B, 200C, and 200D, which may be used in a method of forming a thin film, according to example embodiments.

Each of the deposition systems 200A, 200B, 200C, and 200D shown in FIGS. 2A to 2D may include a fluid transmission unit 210, a thin-film formation unit 250 configured to perform a deposition process of forming a thin film on a substrate W by using a process gas supplied from a source container 212 included in the fluid transmission unit 210, and an exhaust system 270 configured to exhaust gases or by-products, which may remain after a reaction occurs in the thin-film formation unit 250.

The thin-film formation unit 250 may include a reaction chamber 254 including a susceptor 252 configured to support the substrate W. A shower head 256 may be installed at a top end unit of the inside of the reaction chamber 254. The shower head 256 may be configured to supply gas supplied from the fluid transmission unit 210 onto the substrate W.

The fluid transmission unit 210 may include an inlet line 222 configured to supply a carrier gas from the outside to the source container 212 and an outlet line 224 configured to supply a source compound contained in the source container 212 to the thin-film formation unit 250. A valve V1 and a mass flow controller (MFC) M1 may be installed at the inlet line 222, and a valve V2 and an MFC M2 may be installed at the outlet line 224. The inlet line 222 and the outlet line 224 may be connected to each other through a bypass line 226. A valve V3 may be installed at the bypass line 226. The valve V3 may operate due to a pneumatic pressure by using an electric motor or another remote-control unit.

The source compound supplied from the source container 212 may be supplied into the reaction chamber 254 through an inlet line 266 of the thin-film formation unit 250, which is connected to the outlet line 224 of the fluid transmission unit 210. When necessary, the source compound supplied from the source container 212 may be supplied into the reaction chamber 254 together with a carrier gas supplied through an inlet line 268. A valve V4 and an MFC M3 may be installed at the inlet line 268 into which the carrier gas is supplied.

The thin-film formation unit 250 may include an inlet line 262 configured to supply a purge gas into the reaction chamber 254 and an inlet line 264 configured to supply a reactive gas. A valve V5 and an MFC M4 may be installed at the inlet line 262, and a valve V6 and an MFC M5 may be installed at the inlet line 264.

The process gas used in the reaction chamber 254 and reaction by-products to be discarded may be exhausted to the outside through an exhaust system 270. The exhaust system 270 may include an exhaust line 272 connected to the reaction chamber 254 and a vacuum pump 274 installed at the exhaust line 272. The vacuum pump 274 may eliminate the process gas and the reaction by-products, which are exhausted from the reaction chamber 254.

A trap 276 may be installed in the exhaust line 272 at an upstream side of the vacuum pump 274. The trap 276 may trap, for example, reaction by-products, which are generated by unreacted process gases in the reaction chamber 254, and prevent the reaction by-products from flowing into the vacuum pump 274 at a downstream side.

In a method of forming a thin film, according to an embodiment, a niobium compound of General formula I may be used as a source compound. For example, the niobium compound according to the embodiment may be in a liquid phase at ambient temperature and highly reactive with other process gases, e.g., a reactive gas (e.g., an oxidizing gas or a reducing gas). For example, the trap 276 installed at the exhaust line 272 may trap attachments (e.g., reaction by-products), which may occur due to a reaction between the process gases, and may help reduce the possibility of or prevent the attachments from flowing to a downstream side of the trap 276. The trap 276 may be configured to be cooled by a cooler, e.g., a water cooling device.

In addition, a bypass line 278 and an automatic pressure controller (APC) 280 may be installed in the exhaust line 272 at an upstream side of the trap 276. A valve V7 may be installed at the bypass line 278, and a valve V8 may be installed at a portion of the exhaust line 272, which may extend parallel to the bypass line 278.

Figure 2A:
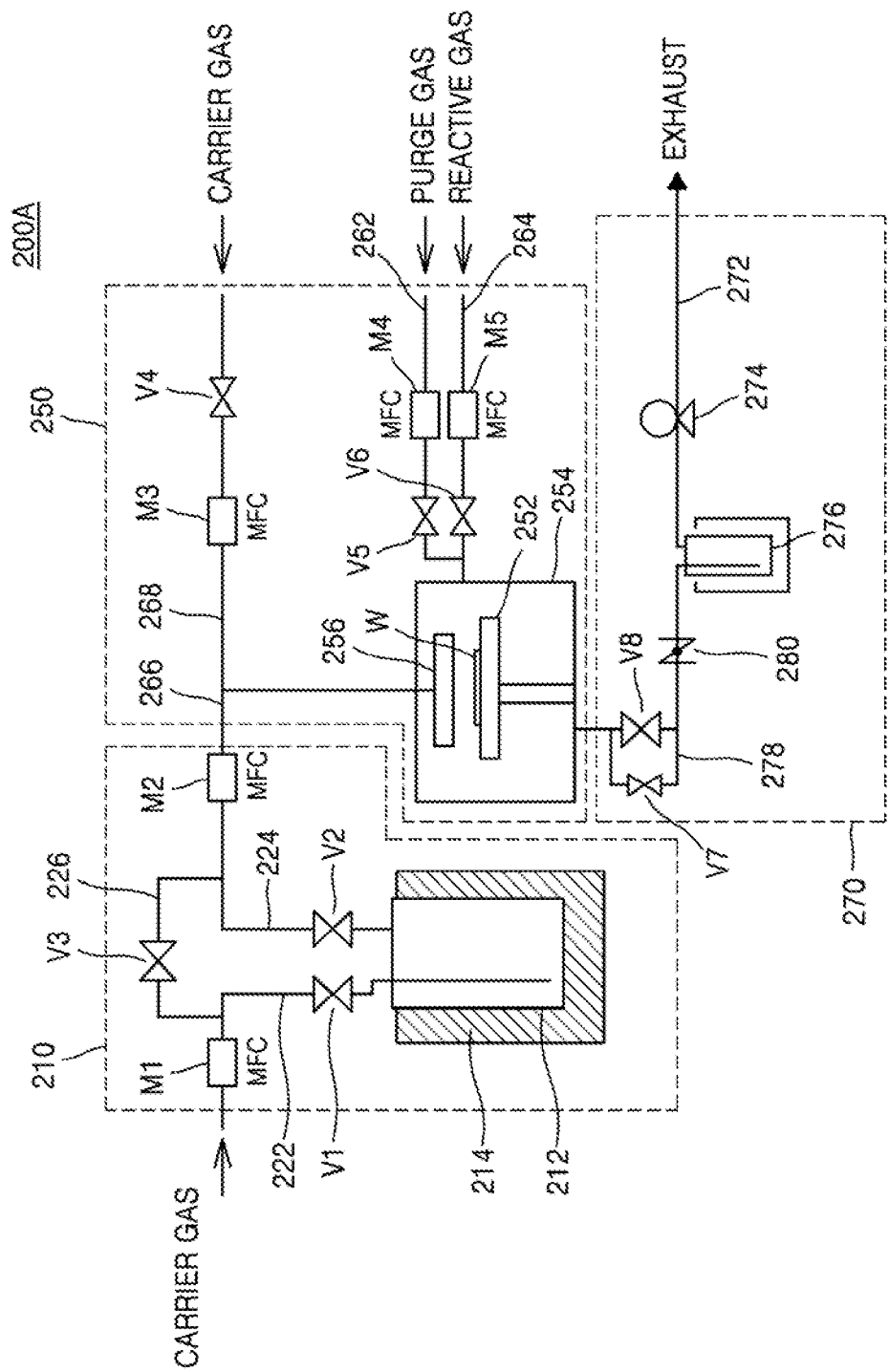
FIGS. 2A to 2D illustrate diagrams of configurations of deposition systems, which may be used in a method of forming a thin film according to example embodiments.
Figure 2B:
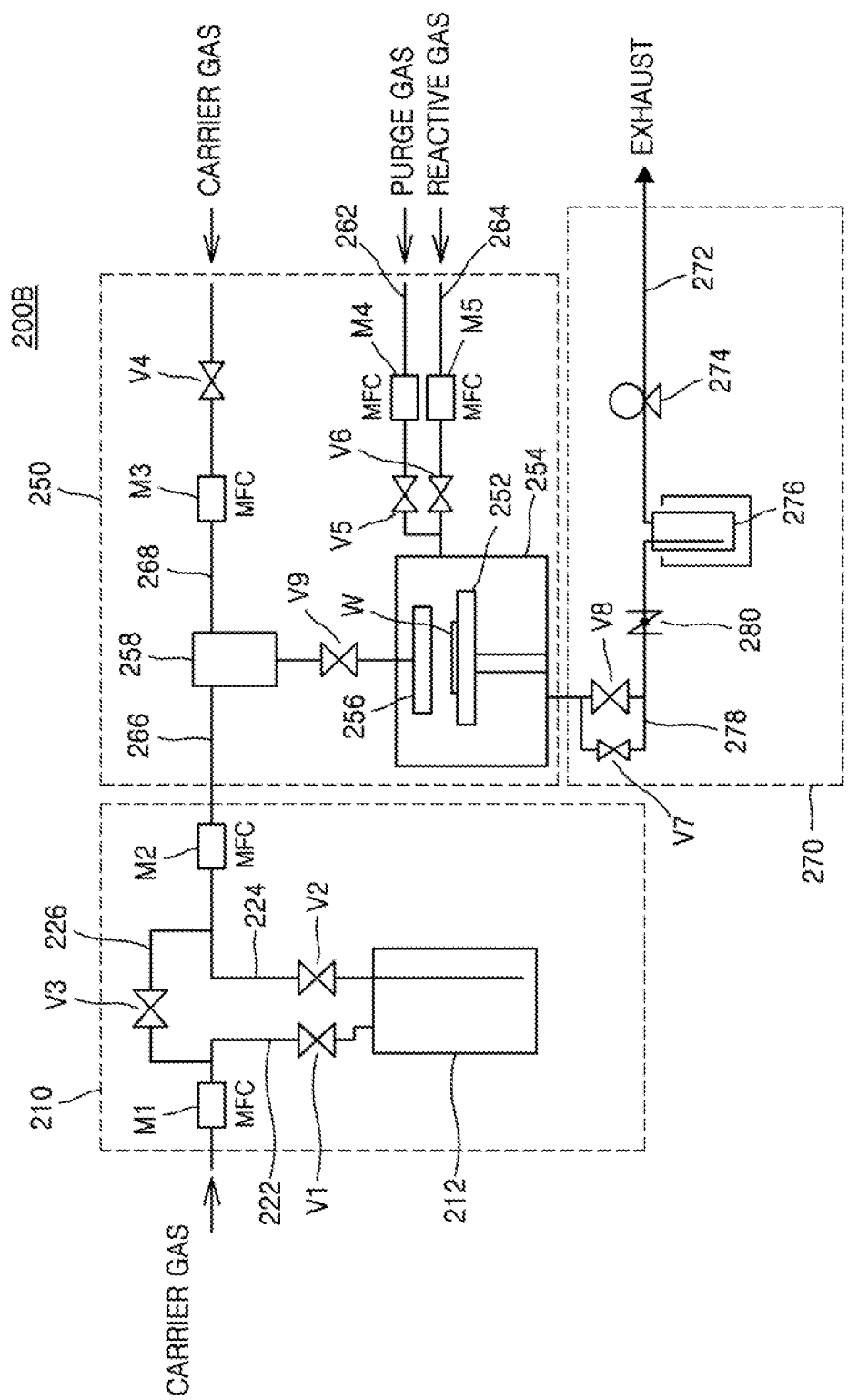

As in the deposition systems 200A and 200C shown in FIGS. 2A and 2B, a heater 214 may be installed in the source container 212. A source compound contained in the source container 212 may be maintained at a relatively high temperature by the heater 214.

Figure 2C:
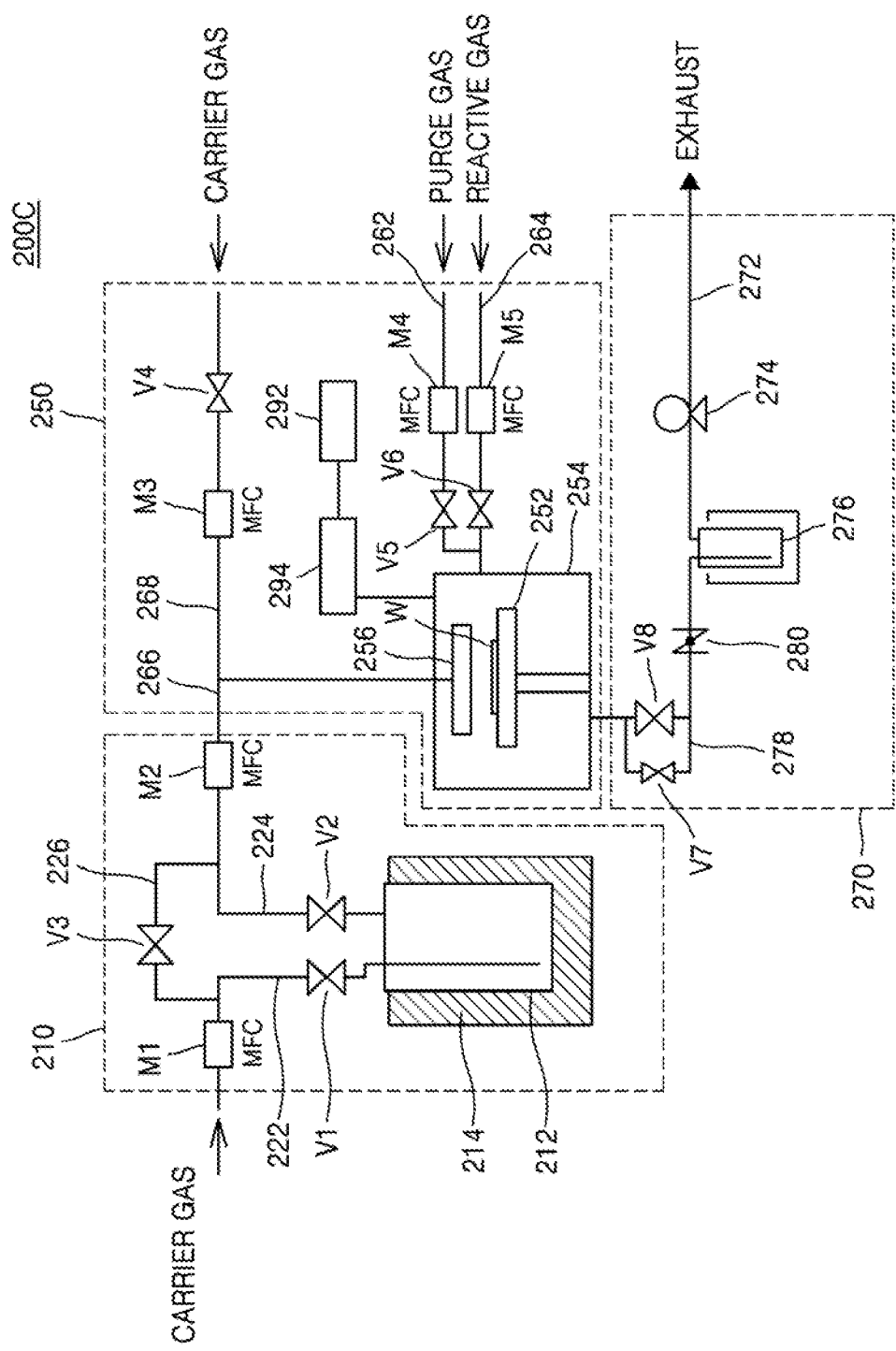
Figure 2D:
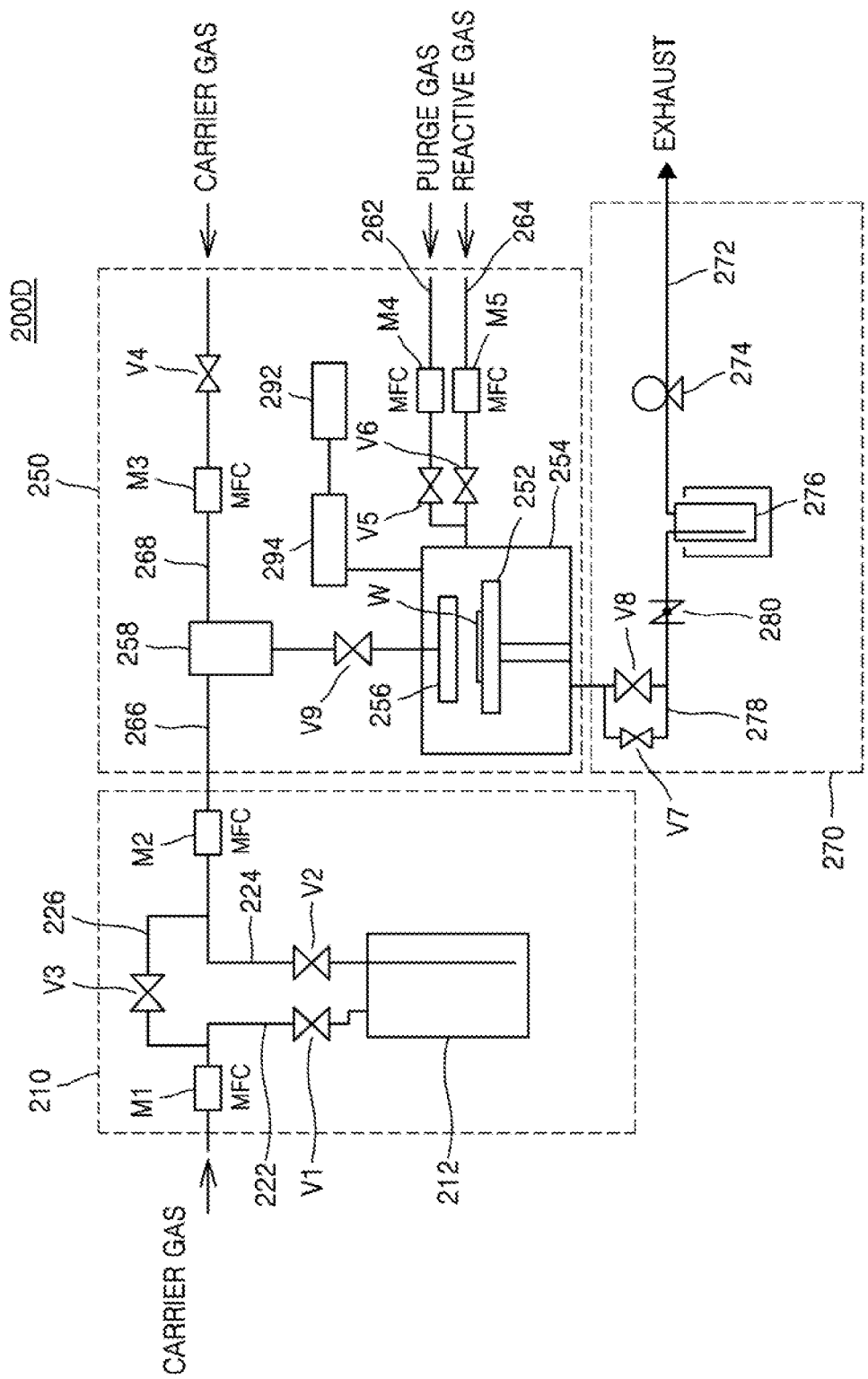

As in the deposition systems 200B and 200D shown in FIGS. 2B and 2D, a vaporizer 258 may be installed at the inlet line 266 of the thin-film formation unit 250. The vaporizer 258 may vaporize a fluid supplied in a liquid phase from the fluid transmission unit 210 and supply the vaporized source compound into the reaction chamber 254. The source compound vaporized by the vaporizer 258 may be supplied into the reaction chamber 254 together with a carrier gas supplied through the inlet line 268. The supplying of the source compound into the reaction chamber 254 through the vaporizer 258 may be controlled by a valve V9.

As in the deposition systems 200C and 200D shown in FIGS. 2C and 2D, to generate plasma in the reaction chamber 254, the thin-film formation unit 250 may include a radio-frequency (RF) power source 292 and an RF matching system 294, which are connected to the reaction chamber 254.

In an implementation, as illustrated in FIGS. 2A to 2D, one source container 212 may be connected to the reaction chamber 254. In an implementation, a plurality of source containers 212 may be provided in the fluid transmission unit 210, and each of the plurality of source containers 212 may be connected to the reaction chamber 254. In an implementation, a suitable number of source containers 212 may be connected to the reaction chamber 254. In an implementation, the source compound containing the niobium compound of General formula I may be vaporized by using the vaporizer 258 of any one of the deposition systems 200B and 200D shown in FIGS. 2B and 2D. In an implementation, in the method of forming the thin film, according to the embodiment, any one of the deposition systems 200A, 200B, 200C, and 200D shown in FIGS. 2A to 2D may be used to form the niobium-containing film on the substrate W.

To form the niobium-containing film on the substrate W according to process P30 of FIG. 1, the source compound for forming a thin film, which contains the niobium compound of General formula I, may be transported by using various methods and supplied into a reaction chamber of a thin-film forming system, e.g., the reaction chamber 254 of each of the deposition systems 200A, 200B, 200C, and 200D shown in FIGS. 2A to 2D.

A source material for forming a thin film, which is used in the method of forming the thin film, according to the embodiment, may include the niobium compound of General formula I. For example, in the method of forming the thin film, according to the embodiment, the niobium compound according to the embodiment may be used as a precursor. For example, when a thin film including only niobium as a metal is to be formed, a thin-film forming source that is used in the method of forming the thin film according to the embodiment may not contain a metal compound and a semimetal compound other than the niobium compound of General formula 1. In an implementation, when a niobium-containing film including at least two metals and/or semimetals is to be manufactured, the thin-film forming source that is used in the method of forming the thin film, according to the embodiment, may include the niobium compound of General formula I, another compound containing a desired metal, and/or a compound (hereinafter, referred to as "another precursor") containing a semimetal. The thin-film forming source that is used in the method of forming the thin film, according to the embodiment, may further include an organic solvent and/or a nucleophilic reagent. The niobium compound of General formula I may have appropriate physical properties to be applied to a CVD process or an ALD process, and the niobium compound of General formula 1 may be usefully applied to the CVD process or the ALD process in the method of forming the thin film, according to the embodiment.

When the thin-film forming source is used as a CVD source in the method of forming the thin film, according to the embodiment, a type of the thin-film forming source may be appropriately selected according to a transporting method used in a CVD process. A gas transporting method or a liquid transporting method may be used as the transporting method.

When the gas transporting method is used, a CVD source may be vaporized by heating and/or depressurizing in a storage container (e.g., the source container 212) to generate vapor. The vapor may be introduced together with a carrier gas (e.g., argon, nitrogen, and helium) used as needed into a reaction chamber (e.g., the reaction chamber 254 shown in FIGS. 2A to 2D in which a substrate is loaded.

When the liquid transporting method is used, a thin-film forming source including the niobium compound of General formula I may be conveyed in a liquid phase or a solution state to the vaporizer (refer to 258 in FIG. 2B or FIG. 2D) and heated and/or depressurized and vaporized in the vaporizer 258 to generate vapor, and the vapor may be introduced into the reaction chamber 254.

The gas transporting method may use the niobium compound of General formula I as a CVD source. The liquid transporting method may use, as a CVD source, the niobium compound of General formula I or a solution obtained by dissolving the niobium compound of General formula I in an organic solvent. These CVD sources may further include another precursor, a nucleophilic reagent, or a combination thereof.

In an implementation, a multi-component CVD process may be used to form a niobium-containing film in the method of forming the thin film according to the embodiment. The multi-component CVD process may be performed by using a method (hereinafter, referred to as a "single source method") of independently vaporizing and supplying respective components of a source compound to be used in a CVD process or a method (hereinafter, referred to as a "cocktail source method") of vaporizing and supplying a source mixture obtained by previously mixing multi-component sources in a desired composition. When the cocktail source method is used, a first mixture containing the niobium compound according to the embodiment, a first mixed solution obtained by dissolving the first mixture in an organic solvent, a second mixture containing the niobium compound according to the embodiment and another precursor, or a second mixed solution obtained by dissolving the second mixture in an organic solvent may be used as a source compound for forming a thin film in a CVD process.

Organic solvents, which may be used to obtain the first mixed solution or the second mixed solution, may be suitable organic solvents. In an implementation, the organic solvent may include, e.g., acetate esters such as ethyl acetate, n-butyl acetate, and methoxyethyl acetate; ethers such as tetrahydrofuran, tetrahydropyran, ethylene glycol dimethyl ether, diethylene glycol dimethyl ether, triethylene glycol dimethyl ether, dibutyl ether, and dioxane; ketones such as methyl butyl ketone, methyl isobutyl ketone, ethyl butyl ketone, dipropyl ketone, diisobutyl ketone, methyl amyl ketone, cyclohexanone, and methylcyclohexanone; hydrocarbons such as hexane, cylclohexane, methylcyclohexane, dimethylcyclohexane, ethylcyclohexane, heptane, octane, toluene, and xylene; hydrocarbons having a cyano group such as 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene; pyridine; or lutidine. The above-described organic solvents may be used alone or in a mixture of at least two kinds thereof considering the relationships among solubilities, use temperatures, boiling points, and ignition points of solutes. When the organic solvent is used, the total amount of the precursor may range from about 0.01 mol/L to about 2.0 mol/L, e.g., about 0.05 mol/L to about 1.0 mol/L in a CVD source, which is a solution obtained by dissolving the precursor in the organic solvent. Here, the total amount of the precursor refers to the amount of the niobium compound of General formula I when the thin-film forming source used in the method of forming the thin film, according to the embodiment, does not include a metal compound and a semimetal compound other than the niobium compound of General formula I, and refers to the sum of amounts of the niobium compound of General formula I and another precursor when the thin-film forming source includes the niobium compound of General formula I and a compound including another metal and/or a compound including a semimetal.

In the method of forming the thin film, according to the embodiment, when a multi-component CVD process is used to form the niobium-containing film, a suitable kind of another precursor that may be used together with the niobium compound according to the embodiment, e.g., precursors that may be used as a source compound in a CVD process may be adopted.

In an implementation, another precursor that may be used in a method of forming a thin film, according to an embodiment, may include a compound of at least one organic coordination compound selected out of an alcohol compound, a glycol compound, a β-diketone compound, a cyclopentadiene compound, and an organic amine compound, and any one selected out of silicon and a metal. In an implementation, the other precursor may include, e.g., lithium (Li), sodium (Na), potassium (K), magnesium (Mg), calcium (Ca), strontium (Sr), barium (Ba), titanium (Ti), zirconium (Zr), hafnium (Hf), vanadium (V), tantalum (Ta), chromium (Cr), molybdenum (Mo), tungsten (W), manganese (Mn), iron (Fe), cobalt (Co), rhodium (Rh), iridium (Ir), nickel (Ni), palladium (Pd), platinum (Pt), silver (Ag), copper (Cu), gold (Au), zinc (Zn), aluminum (Al), gallium (Ga), indium (In), germanium (Ge), tin (Sn), lead (Pb), antimony (Sb), bismuth (Bi), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), or ruthenium (Ru). In an implementation, an alcohol compound that may be used as the organic coordination compound of the other precursor may include, e.g., alkyl-alcohols such as methanol, ethanol, propanol, isopropyl alcohol, butanol, sec-butyl alcohol, isobutyl alcohol, tert-butyl alcohol, pentyl alcohol, isopentyl alcohol, and tert-pentyl alcohol; ether-alcohols such as 2-methoxyethanol, 2-ethoxyethanol, 2-butoxyethanol, 2-(2-methoxyethoxy)ethanol, 2-methoxy-1-methylethanol, 2-methoxy-1,1-dimethylethanol, 2-ethoxy-1,1-dimethylethanol, 2-isopropoxy-1,1-dimethylethanol, 2-butoxy-1,1-dimethylethanol, 2-(2-methoxyethoxy)-1,1-dimethylethanol, 2-propoxy-1,1-diethylethanol, 2-s-butoxy-1,1-diethylethanol, or 3-methoxy-1,1-dimethylpropanol; or dialkylaminoalcohols such as dimethyl amino ethanol, ethyl methyl amino ethanol, diethyl amino ethanol, dimethyl amino-2-pentanol, ethyl methyl amino-2-pentanol, dimethyl amino-2-methyl-2-pentanol, ethyl methyl amino-2-methyl-2-pentanol, or diethyl amino-2-methyl-2-pentanol. In an implementation, a glycol compound that may be used as the organic coordination compound of the other precursor may include, e.g., 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-butanediol, 2-ethyl-2-butyl-1,3-propanediol, 2,4-pentanediol, 2-methyl-1,3-propanediol, 2-methyl-2,4-pentanediol, 2,4-hexanediol, or 2,4-dimethyl-2,4-pentanediol. In an implementation, a β-diketone compound that may be used as the organic coordination compound of the other precursor may be, e.g., alkyl-substituted β-diketones such as acetylacetone, hexane-2,4-dione, 5-methylhexane-2,4-dione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-tetramethylheptane-3,5-dione, octane-2,4-dione, 2,2,6-trimethyloctane-3,5-dione, 2,6-dimethyloctane-3,5-dione, 2,9-dimethylnonane-4,6-dione, 2-methyl-6-ethyldecane-3,5-dione, and 2,2-dimethyl-6-ethyldecane-3,5-dione; fluorine-substituted alkyl β-diketones such as 1,1,1-trifluoropentane-2,4-dione, 1,1,1-trifluoro-5,5-dimethylhexane-2,4-dione, 1,1,1,5,5,5-hexafluoropentane-2,4-dione, and 1,3-diperfluorohexylpropane-1,3-dione; and ether-substituted β-diketones such as1,1,5,5-tetramethyl-1-methoxyhexane-2,4-dione, 2,2,6,6-tetramethyl-1-methoxyheptane-3,5-dione, or 2,2,6,6-tetramethyl-1-(2-methoxyethoxy)heptane-3,5-dione. In an implementation, a cyclopentadiene compound that may be used as the organic coordination compound of the other precursor may be, e.g., cyclopentadiene, methylcyclopentadiene, ethylcyclopentadiene, propylcyclopentadiene, isopropylcyclopentadiene, butylcyclopentadiene, sec-butylcyclopentadiene, isobutylcyclopentadiene, tert-butylcyclepentadiene, dimethylcyclopentadiene, or tetramethylcyclopentadiene. In an implementation, an organic amine compound that may be used as the organic coordination compound of the other precursor may be, e.g., methylamine, ethylamine, propylamine, isopropylamine, butyl amine, sec-butyl amine, tert-butyl amine, isobutyl amine, dimethylamine, diethylamine, dipropylamine, diisopropylamine, ethylmethylamine, propylmethylamine, or isopropylmethylamine.

In an implementation, other precursors may be a suitable material, and a suitable method of preparing the other precursor may be used. In an implementation, when an alcohol compound is used as the organic coordination compound of the other precursor, a precursor may be prepared by causing a reaction of an inorganic salt of the above-described metal or a hydrate thereof with an alkali metal alkoxide of the corresponding alcohol compound. Here, the inorganic salt of the metal or the hydrate thereof may include a metal halide or a metal nitride. The alkali metal alkoxide may include sodium alkoxide, lithium alkoxide, and potassium alkoxide.

When a single source method is used, the other precursor may include a compound that is similar in thermal and/or oxidative decomposition behavior to the niobium compound of General formula I. When a cocktail source method is used, the other precursor may include a material, which is similar in thermal and/or oxidative decomposition behavior to the niobium compound of General formula I and does not deteriorate due to a chemical reaction when mixed with the niobium compound of General formula I.

Furthermore, the thin-film forming source that may be used in the method of forming the thin film, according to the embodiment, may include a nucleophilic reagent to give stability to the niobium compound of General formula I, according to the embodiment, and the other precursor as needed. The nucleophilic reagent may be ethylene glycol ethers such as glyme, diglyme, triglyme, and tetraglyme; crown ethers such as 18-crown-6, dicyclohexyl-18-crown-6, 24-crown-8, dicyclohexyl-24-crown-8, and dibenzo-24-crown-8; polyamines such as etheylene diamine, N,N'-tetramethylethyl diamine, diethylene triamine, triethylene teramine, tetraethylene pentamine, pentaethylene hexamine, 1,1,4,7,7-pentamethyldiethylene triamine, 1,1,4,7,10,10-hexamethyltriethylene tetramine, and triethoxytriethylene amine; cyclic polyamines such as cyclam and cyclen; heterocyclic compounds such as pyridine, pyrrolidine, piperidine, morpholine, N-methyl pyrrolidine, N-methyl piperidine, N-methyl morpholine, tetrahydrofurane, tetrahydropyran, 1,4-dioxane, oxazole, thiazole, and oxathiolane; β-ketoesters such as acetoacetic acid methyl, acetoacetic acid ethyl, and acetoacetic acid-2-methoxy ethyl; or β-diketones such asacetylacetone, 2,4-hexanedione, 2,4-heptanedione, 3,5-heptanedione, and dipivaloylmethane. The nucleophilic reagent may be used in the range of about 0.1 mol to about 10 mol, e.g., about 1 mol to about 4 mol, based on 1 mol of the total amount of the precursor.

The thin-film forming source used when the niobium-containing film is formed by using the method of forming the thin film, according to the embodiment, may be maintained without containing an impurity metal component, an impurity halogen component (e.g., impurity chlorine), and an impurity organic component other than a main component included therein.

In an implementation, one type of metal may be included as the impurity metal component in the thin-film forming source in an amount of about 100 ppb or less, e.g., about 10 ppb or less, based on the total amount of the thin-film forming source. In addition, the total amount of the impurity metal component may be included in the thin-film forming source in an amount of about 1 ppm or less, e.g., about 100 ppb or less. For example, when a niobium-containing film included in a gate insulating film, a gate electrode layer, or a conductive barrier film, which constitutes a large-scale integration (LSI) device, is formed, it may be necessary to minimize the contents of an alkali metal element and an alkali earth metal element, which affect the electrical characteristics of a resultant thin film. In an implementation, the impurity halogen component may be included in the thin-film forming source in an amount of about 100 ppm or less, e.g., about 10 ppm or less, or about 1 ppm or less, based on the total amount of the thin-film forming source.

In an implementation, the impurity organic component may be included in the thin-film forming source in an amount of about 500 ppm or less, e.g., about 50 ppm or less, or about 10 ppm or less, based on the total amount of the thin-film forming source.

In the thin-film forming source, moisture may cause particles in a CVD source or cause particles during a thin-film forming process. Accordingly, to reduce moisture of each of the precursor, the organic solvent, and the nucleophilic reagent, the moisture of each of the precursor, the organic solvent, and the nucleophilic reagent may be previously removed before use thereof. In an implementation, a moisture content of each of the precursor, the organic solvent, and the nucleophilic reagent may be about 10 ppm or less, e.g., about 1 ppm or less.

In an implementation, when the niobium-containing film is formed by using the method of forming the thin film according to the embodiment, to reduce an impurity content of the thin-film forming source, a filtration process may be performed before the thin-film forming source is introduced into a reaction chamber for forming the thin film.

In an implementation, when the niobium-containing film is formed by using the method forming the thin film, according to the embodiment, an atmosphere in which particles are minimized may be maintained as a thin-film forming atmosphere to reduce or prevent the contamination of the niobium-containing film with particles. For example, when particles are measured in a liquid phase by using a light-scattering-type submerged particle detector, the number of particles having a size of more than about 0.3 µm may be adjusted to 100 or less in 1 ml of a liquid. In another example, the number of particles having a size of more than about 0.2 µm may be adjusted to 1000 or less in 1 ml of a liquid. In yet another example, the number of particles having a size of more than about 0.2 µm may be adjusted to 100 or less in 1 ml of a liquid.

In the method of forming the thin film, according to the embodiment, vapor generated by vaporizing a niobium compound provided according to an embodiment or a mixture of the niobium compound and another precursor may be supplied onto a substrate together with a reactive gas, which may be used as needed. Thus, precursors may be sequentially decomposed and/or reacted on the substrate depending on a CVD process. As a result, a niobium-containing film may be grown and deposited on the substrate.

In the method of forming the thin film, according to the embodiment, suitable methods of transporting and depositing the thin-film forming source and conditions and apparatuses for manufacturing the thin-film forming source may be used.

The reactive gas that may be used in the method of forming the thin film, according to the embodiment, may include, e.g., an oxidizing gas, a reducing gas, or a nitrogen-containing gas. The oxidizing gas may be, e.g., oxygen, ozone, nitrogen dioxide, nitrogen monoxide, water vapor, hydrogen peroxide, a formic acid, an acetic acid, or acetic anhydride. The reducing gas may be, e.g., hydrogen or nitrogen. Examples of the nitrogen-containing gas may include organic amine compounds, e.g., monoalkylamine, dialkylamine, trialkylamine, and alkylenediamine, hydrazine, and ammonia, and one of the examples or a gas mixture of at least two thereof may be used. The niobium compound of General formula I may have good reactivity with ammonia, ammonia may be used when one type of nitrogen-containing gas is used, and a gas mixture containing ammonia may be used when a gas mixture of at least two types of nitrogen-containing gases is used.

In the method of forming the thin film according to the embodiment, a vapor transporting method, a liquid transporting method, a single source method, or a cocktail source method, which are described above, may be used to supply a thin-film forming source to the reaction chamber.

In an implementation, in the method of forming the thin film, according to the embodiment, the niobium-containing film may be formed by using a thermal CVD process of forming a thin film by reacting a source gas or both the source gas and a reactive gas due to only heat, a plasma CVD process of forming a thin film by using heat and plasma, a photo-CVD process of forming a thin film by using heat and light, a photo-plasma CVD process of forming a thin film by using heat, light, and plasma, or an ALD process of dividing a CVD reaction into basic unit processes and depositing a thin film by stages on a molecular level.

In the method of forming the thin film, according to the embodiment, the substrate that may be used in process P20 of FIG. 1 may include silicon; ceramics such as silicon nitride, titanium nitride, tantalum nitride, titanium oxide, niobium oxide, zirconium oxide, hafnium oxide, and lanthanum oxide; glass; and/or a metal such as a metal cobalt. The substrate may have a plate shape, a spherical shape, a fiber shape, or a scale shape. A surface of the substrate may have a planar structure or a three-dimensional (3D) structure including a trench structure.

In the method of forming the thin film, according to the embodiment, thin-film forming conditions for forming the niobium-containing film may include a reaction temperature (or substrate temperature), a reaction pressure, and a deposition speed.

The reaction temperature may be a temperature at which a niobium compound according to an embodiment, e.g., a niobium compound of General formula 1, may sufficiently react. In an implementation, the reaction temperature may be, e.g., a temperature of about 100° C. or higher. In an implementation, the reaction temperature may be, e.g., about 150° C. to about 400° C. or about 200° C. to about 350° C.

In an implementation, the reaction pressure may be, e.g., about 10 Pa to a pressure of an atmospheric pressure in the case of a thermal CVD process or a photo-CVD process, and about 10 Pa to about 2000 Pa in the case of a plasma CVD process.

A deposition speed may be controlled by adjusting conditions (e.g., a vaporization temperature and a vaporization pressure) for supplying a thin-film forming source, a reaction temperature, and a reaction pressure. If the deposition speed were to be excessively high, characteristics of a resultant thin film could be degraded. If the deposition speed were to be excessively low, productivity could be reduced. In an implementation, in the method of forming the thin film, according to the embodiment, a deposition speed of the niobium-containing film may be, e.g., about 0.01 nm/min to about 100 nm/min, or about 1 nm/min to about 50 nm/min. When the niobium-containing film is formed by using an ALD process, the number of cycles of ALD processes may be adjusted to control a thickness of the niobium-containing film.

In the method of forming the thin film, according to the embodiment, to form the niobium-containing film according to process P30 of FIG. 1, the thin-film forming source may be vaporized to generate vapor before the thin-film forming source including the niobium compound of General formula I is supplied on the substrate. In this case, the process of vaporizing the thin-film forming source may be performed in a source container or in a vaporizer (e.g., the vaporizer 258 shown in FIG. 2B or 2D). The process of vaporizing the thin-film forming source may be performed at a temperature of about 0° C. to about 150° C. When the thin-film forming source is vaporized in the source container or in the vaporizer, each of an inner pressure of the source container and an inner pressure of the vaporizer may range from about 1 Pa to about 10,000 Pa.

An ALD process may be used to form the niobium-containing film according to process P30 of FIG. 1. In this case, the formation of the niobium-containing film may include vaporizing the thin-film forming source using the above-described various transporting methods to form source vapor, introducing the source vapor into the reaction chamber, forming a precursor thin film on the surface of the substrate using a compound contained in the source vapor, exhausting an unreacted compound gas, and causing a chemical reaction of the precursor thin film with a reactive gas to form the niobium-containing film on the surface of the substrate.

Figure 3:
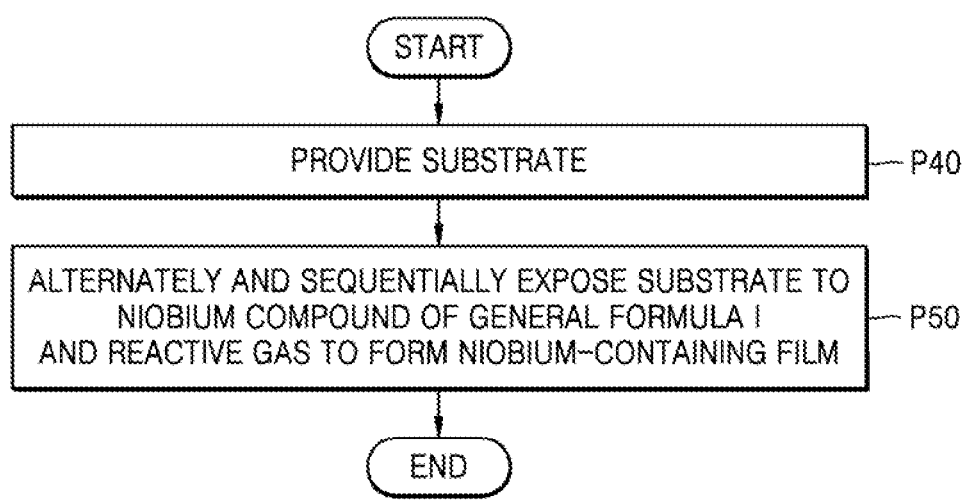
FIG. 3 illustrates a flowchart of a method of forming a thin film, according to embodiments.

FIG. 3 illustrates a flowchart of a method of forming a thin film, according to embodiments. Referring to FIG. 3, a substrate may be provided in process P40. The process P40 of FIG. 3 may be substantially the same as process P20 of FIG. 1.

In process P50 of FIG. 3, a niobium-containing film may be formed by alternately and sequentially exposing the substrate to the niobium compound of General formula I and a reactive gas.

The reactive gas may include an oxidizing gas, a reducing gas, or a nitrogen-containing gas. Specific examples of each of the oxidizing gas, the reducing gas, and the nitrogen-containing gas may be understood with reference to the above description.

To perform process P50, an ALD process may be used.

Figure 4:
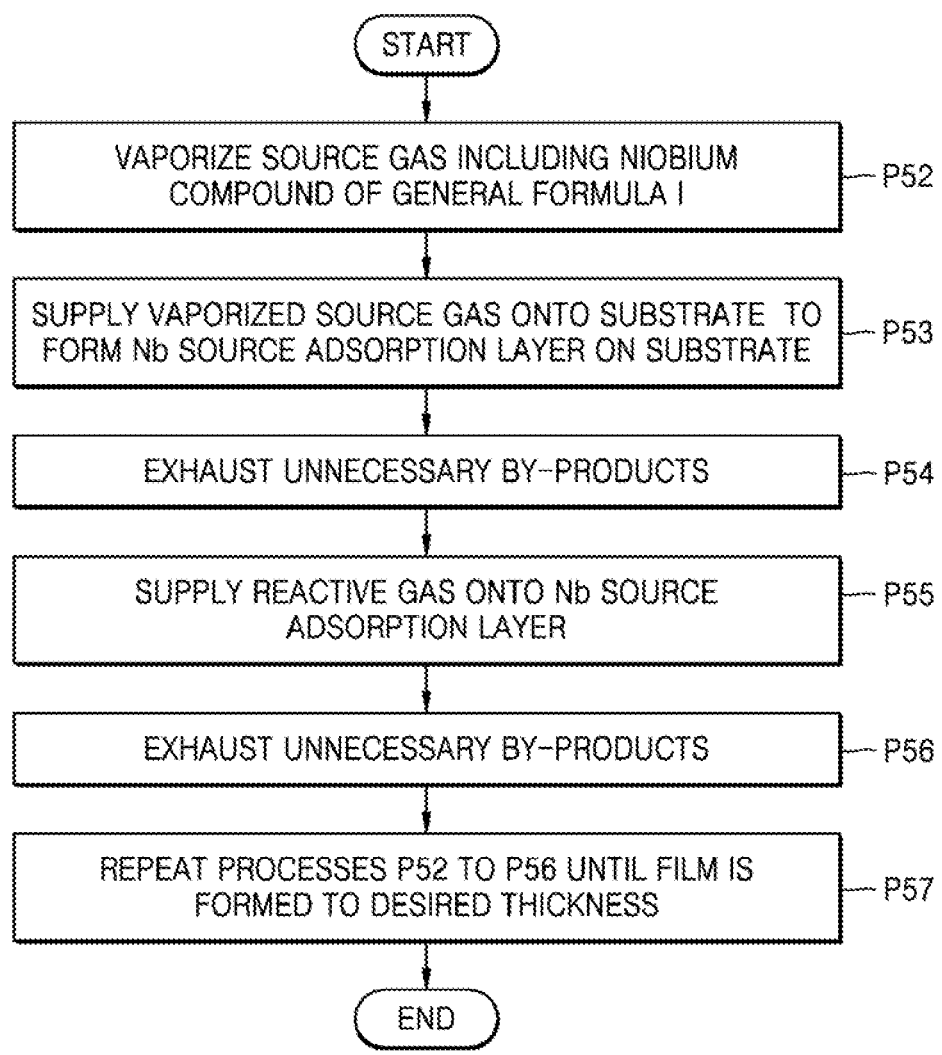
FIG. 4 illustrates a flowchart of a process of forming a niobium-containing film in a method of forming a thin film according to an embodiment.

FIG. 4 illustrates a flowchart of a process of forming a niobium-containing film using an ALD process in process P50 of FIG. 3, according to an example embodiment.

Referring to FIG. 4, in process P52, a source gas including the niobium compound of General formula I may be vaporized.

A temperature and pressure that may be applied to the process of vaporizing the source gas may be substantially the same as in the above-described method of vaporizing the thin-film forming source using a CVD process. For example, the process of vaporizing the source gas may be performed at a temperature of about 0° C. to about 150° C. under a pressure of about 1 Pa to about 10,000 Pa.

In process P53 of FIG. 4, the vaporized source gas may be supplied into the reaction chamber into which the substrate prepared in process P40 of FIG. 3 is loaded and thus, a Nb source adsorption layer may be formed on the substrate. The Nb source adsorption layer may include a chemisorbed layer and a physiosorbed layer of the vaporized source gas.

During the supplying of the vaporized source gas onto the substrate in the reaction chamber, a process temperature may be adjusted by heating the substrate or heating the reaction chamber. The Nb source adsorption layer may be generated by decomposing and/or reacting part of the niobium compound of General formula I and have a composition different from that of a niobium thin film to be finally obtained. In some embodiments, during the formation of the Nb source adsorption layer, a process temperature may be selected in the range of room temperature to about 500° C., e.g., in the range of about 150° C. to about 350° C., and a process pressure may be selected in the range of about 1 Pa to about 10,000 Pa, e.g., about 10 Pa to about 1,000 Pa.

In process P54 of FIG. 4, unnecessary by-products remaining on the substrate may be exhausted from the reaction chamber. By exhausting the unnecessary by-products, unreacted compound gases or the physiosorbed layer of the source gas may be removed from the reaction chamber.

To perform the exhaust process, a process of purging the reaction chamber, a process of reducing a pressure of the reaction chamber to exhaust the reaction chamber, or a combination thereof may be performed.

The process of purging the reaction chamber may be performed using, e.g., an inert gas, such as argon (Ar), helium (He), and neon (Ne), or nitrogen ($N_2$) gas as a purge gas. In the process of reducing a pressure of the reaction chamber, the pressure of the reaction chamber may be reduced to about 0.01 Pa to about 300 Pa, e.g., about 0.01 Pa to about 100 Pa.

In process P55 of FIG. 4, a reactive gas may be supplied onto the Nb source adsorption layer. The reactive gas may include an oxidizing gas, a reducing gas, or a nitrogen-containing gas. Specific examples of each of the oxidizing gas, the reducing gas, and the nitrogen-containing gas are the same as described above.

In an implementation, a nitrogen-containing gas may be supplied as the reactive gas. In this case, after the nitrogen-containing gas may be supplied into the reaction chamber, a niobium nitride film may be obtained from the Nb source adsorption layer formed in process P53 due to an action of the nitrogen-containing gas or actions of the nitrogen-containing gas and heat.

In process P55 of FIG. 4, a reaction temperature may be raised by applying heat to the substrate or the reaction chamber during the supplying of the reactive gas. The reaction temperature may range from room temperature to about 500° C., e.g., about 150° C. to about 350° C. In process P55 of FIG. 4, during the supplying of the reactive gas, a process pressure may range from about 1 Pa to about 10,000 Pa, e.g., about 10 Pa to about 1,000 Pa.

The niobium compound of General formula I may be highly reactive to the nitrogen-containing gas, and a high-quality niobium nitride film having a low residual carbon content may be obtained as a resultant product.

In process P56 of FIG. 4, to remove an excess of the reducing gas and unnecessary by-products remaining on the substrate, the reaction chamber may be exhausted in a similar manner to process P54.

In process P57 of FIG. 4, the processes P52 to P56 of FIG. 4 may be repeated until a film is formed to a desired thickness.

A thin-film deposition process including a series of processes, viz., the processes P52 to P56, may be defined as one cycle, and the cycle may be repeated a plurality of times until a film is formed to a desired thickness. In an implementation, after the cycle is performed once, unreacted gases may be exhausted from the reaction chamber using a method similar to the exhaust process of process P54 or the exhaust process of process P56, and subsequent cycles may be then performed.

When the niobium-containing film is formed by an ALD process using the method described with reference to FIG. 4, energy (e.g., plasma, light, and a voltage) or a catalyst may be applied to the reaction chamber during each process. In an implementation, the energy may be applied for a suitable time period. In an implementation, the above-described examples of energy may be applied when a thin-film forming source is introduced into an ALD system, when a niobium compound is introduced into the reaction chamber, when a vaporized source gas is applied in process P53, when a reactive gas is supplied in process P55, when the exhaust process is performed in process P54 or process P56, or between the respective processes described above.

After the niobium-containing film is formed using the method described with reference to FIG. 4, a process of annealing the niobium-containing film under an inert atmosphere, an oxidizing atmosphere, or a reducing atmosphere may be further performed to obtain better electrical properties. In an implementation, to remove a roughness from the surface of the niobium-containing film, a reflow process may be performed on the niobium-containing film as desired. In an implementation, each of the annealing process and the reflow process may be performed under temperature conditions selected in the range of about 200° C. to about 1,000° C., e.g., about 250° C. to about 500° C.

The process of forming the thin film by using the method according to the embodiment may be performed using any one of the deposition systems shown in FIGS. 2A to 2D. In an implementation, a deposition system may be a batch type system, as shown in FIGS. 2A to 2D, or may be a deposition system capable of simultaneously processing a plurality of substrates using a batch-type furnace.

In the method of forming the thin film, according to the embodiment, a thin film may be formed using a thin-film forming source including the niobium compound of General formula 1. A thin film of a desired kind (e.g., a metal, oxide ceramic, nitride ceramic, glass, and the like) may be provided by appropriately selecting another precursor included in the thin-film forming source, a reactive gas, and thin-film forming conditions. For example, a niobium metal film, a niobium oxide film, a niobium alloy film, or a niobium-containing composite oxide film may be formed by using the method of forming the thin film according to the embodiment. The niobium alloy film may include a niobium-hafnium (Nb—Hf) alloy or a niobium-titanium (Nb—Ti) alloy.

The niobium-containing film formed using the method of forming the thin film, according to the embodiment, may be used for various purposes. In an implementation, the niobium-containing film may be used for, e.g., an electrode material of a memory device represented by dynamic random access memory (DRAM), a resistive film, a diamagnetic film used for a hard disk recording layer, or a solid polymer fuel cell.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHESIS EXAMPLE 1

Synthesis of Methylcyclopentadienyl Niobium Tetrachloride 143 g (1.32 mol) of chlorotrimethylsilane and 458 mL of dehydrated tetrahydrofuran (THF) were put in a 2 L 4-neck flask under an argon (Ar) atmosphere, stirred, and cooled to a temperature of about 10° C. 50.0 g (1.26 mol) of sodium hydride and 509 mL of dehydrated THF were stirred in a further provided 2 L 4-neck flask. 103 g (1.26 mol) of methylcyclopentadiene was added dropwise into the 2 L 4-neck flask while being maintained at a temperature of about 25° C., and then stirred for about 15 hours. The resultant product was added to the THF solution and stirred at a temperature of about 25° C. for 1 hour, to cause a reaction. The reacted liquid was filtered, desolventized, and distilled to obtain 129 g of methylcyclopentadienyltrimethylsilane.

220 g (0.806 mol) of $NbCl_5$ and 1.04 L of dehydrated dichloromethane were added to a new 2 L 4-neck flask, stirred, and cooled. 127 g (0.806 mol) of methylcyclopentadienyltrimethylsilane was added dropwise to the obtained solution and stirred for 2 hours by heating and refluxing the same. The obtained reaction solution was cooled to a temperature of about 0° C., and a liquid on a precipitate was removed from the cooled solution. The resultant was washed with hexane and desolventized to obtain 224 g of methylcyclopentadienylniobiumtetrachloride (yield 96%).

(1) Hydrogen-1 Nuclear Magnetic Resonance ($^1$H-NMR) (Benzene-D6)

6.04 ppm (2H, s), 5.61 ppm (2H, s), 1.85 ppm (3H, s)

(2) Analysis of Elements (Theoretical Value)

Nb: 29.8% (29.6%), C: 23.3% (23.0%), H: 2.0% (2.2%), Cl: 44.9% (45.2%)

SYNTHESIS EXAMPLE 2

Synthesis of the Compound of Formula 2

12.0 g (37.9 mmol) of methylcyclopentadienylniobiumtetrachloride, which was obtained in Synthesis example 1, and 171 mL of dehydrated dichloromethane were added to a 500 mL 4-neck flask under an Ar atmosphere, stirred, and cooled to a temperature of about 0° C. 8.39 g (0.114 mol) of tert-butyl amine was added dropwise into the 500 mL 4-neck flask and stirred for 12 hours by heating and refluxing the same to cause a reaction. The reacted liquid was cooled to a temperature of about 25° C., and 100 mL of dehydrated hexane was added thereto. Thereafter, the resultant product was filtered, desolventized, and distilled to obtain 3.87 g of the compound of Formula 2 (yield 33%).

(1) Normal-Pressure Thermogravimetry-Differential Thermal Analyzer (TG-DTA)

50 mass % and a reduced temperature of 214° C. (760 Torr, argon flow rate of about 100 mL/min, heating rate of about 10° C./min)

(2) $^1$H-NMR (Benzene-D6)

5.90 ppm (2H, m), 5.63 ppm (2H, m), 1.90 ppm (3H, s), 1.06 ppm (9H, s)

(3) Analysis of Elements (Theoretical Value)

Nb: 29.5% (29.6%), C: 38.6% (38.3%), H: 4.8% (5.1%), N: 4.3% (4.4%), Cl: 22.8% (22.6%)

SYNTHESIS EXAMPLE 3

Synthesis of the Compound of Formula 3

122 g (0.386 mol) of methylcyclopentadienylniobiumtetrachloride, which was obtained in Synthesis example 1, and 622 mL of dehydrated dichloromethane were added to a 1 L 4-neck flask under an argon atmosphere, stirred, and cooled to a temperature of about 0° C. 98.6 g (0.964 mol) of triethylamine and 34.0 g (0.386 mol) of tert-amylamine were added dropwise into the 1 L 4-neck flask and stirred for 3 hours by heating and refluxing the same to cause a reaction. The reacted liquid was cooled to a temperature of about 25° C., filtered, desolventized, washed with hexane, and solvent-distilled to obtain 54.4 g of the compound of Formula 3 (yield 43%).

(1) Normal-Pressure TG-DTA 50 mass % and a reduced temperature of 228° C. (760 Torr, Ar flow rate of about 100 mL/min, heating rate of about 10° C./min)

(2) $^1$H-NMR (Benzene-D6)

5.92 ppm (2H, s), 5.65 ppm (2H, s), 1.91 ppm (3H, s), 1.34 ppm (2H, q), 1.03 ppm (6H, s), 0.96 ppm (3H, t)

(3) Analysis of Elements (Theoretical Value)

Nb: 28.4% (28.3%), C: 40.6% (40.3%), H: 5.2% (5.5%), N: 4.3% (4.3%), Cl: 21.5% (21.6%)

SYNTHESIS EXAMPLE 4

Synthesis of the Compound of Formula 6

50.4 g (0.464 mol) of chlorotrimethylsilane and 161 mL of dehydrated THF were added to a 500 mL 4-neck flask under an Ar atmosphere and cooled to a temperature of about 10° C. 17.7 g (0.442 mol) of sodium hydride and 179 mL of dehydrated THF were added to a further provided 500 mL 4-neck flask and stirred. 42.0 g (0.442 mol) of ethylcyclopentadiene was added dropwise into the further provided 500 mL 4-neck flask while being maintained at a temperature of about 25° C., and stirred for 15 hours. The obtained resultant product was added to a chlorotrimethylsilane-containing THF solution and stirred for 1 hour at a temperature of about 25° C. The reacted liquid was filtered, desolventized, and distilled to obtain 50.2 g of ethylcyclopentadienyltrimethylsilane.

75.0 g (0.278 mol) of NbCl$_5$ and 355 L of dehydrated dichloromethane were added to a new 500 mL 4-neck flask, stirred, and cooled to a temperature of about 10° C. 49.5 g (0.292 mol) of ethylcyclopentadienyltrimethylsilane was added dropwise into the resultant solution and then stirred for 2 hours by heating and refluxing the same. The obtained reaction solution was desolventized to obtain 90.0 g of ethylcyclopentadienylniobiumtetrachloride (yield 99%).

Subsequently, 30 g (91.5 mmol) of ethylcyclopentadienylniobiumtetrachloride and 147 mL of dehydrated dichloromethane were added to a 300 mL 4-neck flask, stirred, and cooled to a temperature of about 0° C. 23.2 g (0.229 mol) of trimethylamine and 9.64 g (0.110 mol) of tert-amylamine were sequentially added dropwise into the 300 mL 4-neck flask and stirred for 3 hours by heating and refluxing the same. The reacted liquid was desolventized, and the resultant was washed with hexane, again desolventized, and distilled to obtain 8.26 g of the compound of Formula 6 (yield 28%).

(1) Normal-Pressure TG-DTA 50 mass % and a reduced temperature of about 234° C. (760 Torr, Ar flow rate of about 100 mL/min, heating rate of about 10° C./min)

(2) $^1$H-NMR (Benzene-D6)

5.93 ppm (2H, m), 5.76 ppm (2H, m), 2.39 ppm (2H, q), 1.35 ppm (2H, q), 1.04 ppm (6H, s), 0.95 ppm (6H, m)

(3) Analysis of Elements (Theoretical Value)

Nb: 27.4% (27.2%), C: 42.4% (42.1%), H: 5.5% (5.9%), N: 4.2% (4.1%), Cl: 20.5% (20.7%)

ESTIMATION EXAMPLES 1 TO 3 AND COMPARATIVE ESTIMATION EXAMPLES 1 TO 3

Estimation of Physical Properties of Niobium Compounds

Results obtained by visually observing phases of the compounds of Formulas 2, 3, and 6, which were obtained in Synthesis Examples 2, 3, and 4, at a temperature of about 25° C., are shown in Table 1 along with results of each of a comparative compound 1 of Formula 37, a comparative compound 2 of Formula 38, and a comparative compound 3 of Formula 39. Table 1 also shows melting points of compounds that are solids at a temperature of about 25° C.

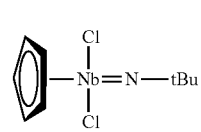

[Formula 37]

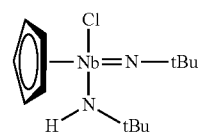

[Formula 38]

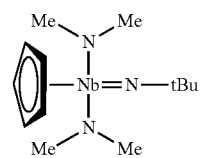

[Formula 39]

TABLE 1

| | Compound | Phase at 25° C. | Melting point (° C.) |
|---|---|---|---|
| Estimation Example 1 | Formula 2 | Solid | 40 |
| Estimation Example 2 | Formula 3 | Liquid | — |
| Estimation Example 3 | Formula 6 | Liquid | — |
| Comparative Estimation Example 1 | Formula 37 | Solid | 95 |
| Comparative Estimation Example 2 | Formula 38 | Solid | 70 |
| Comparative Estimation Example 3 | Formula 39 | Liquid | — |

As shown in Table 1, it may be seen that the compounds of Formulas 3 and 6 and the comparative compound of Formula 39 were liquids at a temperature of about 25° C. Also, although the compound of Formula 2 was a solid at a temperature of about 25° C., the compound of Formula 2 had a relatively low melting point of about 40° C. In contrast, it may be seen that the comparative examples of Formulas 37 and 38 had melting points of about 70° C. or higher.

THIN-FILM FORMATION EXAMPLES 1 TO 3 AND THIN-FILM FORMATION COMPARATIVE EXAMPLES 1 to 3

By using each of the compounds of Formulas 2, 3, and 6, which were obtained in Synthesis Examples 2, 3, and 4, and the comparative compounds 1 to 3 of Formulas 37, 38, and 39 as a thin-film forming source, an ALD process was performed using the deposition system 200A of FIG. 2A under the following conditions to form niobium nitride films on silicon substrates. A thickness of each of the obtained niobium nitride films was measured using an X-ray reflectivity technique, a compound of each of the niobium nitride films was confirmed using an X-ray diffraction (XRD) technique, and a carbon (C) content of each of the niobium nitride films was measured using an X-ray photoelectron spectroscopy (XPS) technique. Measurement results are shown in Table 2.

<Conditions>
Reaction temperature (or substrate temperature) of about 250° C., a reactive gas: ammonia gas
<Process>
One cycle including a series of processes (1) to (4) was repeated 150 times.

(1) Vapor generated by vaporizing a CVD source under conditions where a source container was heated to a temperature of about 90° C. and maintained under a pressure of about 100 Pa was introduced into a reaction chamber, and a thin film was deposited for about 30 seconds in the reaction chamber, which was maintained under a pressure of about 100 Pa.

(2) An argon purge process was performed for about 10 seconds to remove unreacted sources from the reaction chamber.

(3) A reactive gas was introduced into the reaction chamber to cause a reaction for about 30 seconds under a pressure of about 100 Pa.

(4) An argon purge process was performed for about 10 seconds to remove unreacted sources from the reaction chamber.

TABLE 2

| | Source compound | Thickness of thin film | Compound of thin film | Carbon content of thin film |
|---|---|---|---|---|
| Thin-film formation Example 1 | Formula 2 | 6 nm | NbN | Non-detection *1 |
| Thin-film formation Example 2 | Formula 3 | 9 nm | NbN | Non-detection *1 |
| Thin-film formation Example 3 | Formula 6 | 8 nm | NbN | Non-detection *1 |
| Thin-film formation Comparative Example 1 | Formula 37 | 3 nm | NbN | 5 atm % |
| Thin-film formation Comparative Example 2 | Formula 38 | 2 nm | NbN | 7 atm % |
| Thin-film formation Comparative Example 3 | Formula 39 | 2 nm | NbN | 10 atm % |

*1: Detection limit of 0.1 atm % (atomic %)

As shown in Table 2, a carbon content of each of the niobium nitride films, which were obtained by using the comparative compounds 1 to 3 of Formulas 37, 38, and 39 as source compounds, was about 5 atm % or higher. In contrast, a carbon content of each of the niobium nitride films, which were obtained by using the compounds of Formulas 2, 3, and 6 as source compounds, was lower than the detection limit of 0.1 atm %. From the results shown in Table 2, it may be seen that high-quality thin-films were obtained by using the niobium compounds of General formula I. Furthermore, a thickness of each of the niobium nitride films, which were obtained by using the comparative compounds 1 to 3 of Formulas 37, 38, and 39 as source compounds, was about 3 nm or less. In contrast, a thickness of each of the niobium nitride films, which were obtained by using the compounds of Formulas 2, 3, and 6 as source compounds, was 6 nm or more. From the above-described results, it may be seen that highly productive thin films were obtained using the niobium compounds of General formula I. For example, it may be seen that the compounds of Formulae 3 and 6 may be used as excellent CVD sources in that the compounds of Formulae 3 and 6 are liquids at a temperature of about 25° C. and may be used as CVD sources to obtain highly productive thin films.

FIGS. 5A to 5J illustrate cross-sectional views of stages in a method of manufacturing an IC device (refer to 300 in FIG. 5J) according to embodiments.

Figure 5A:
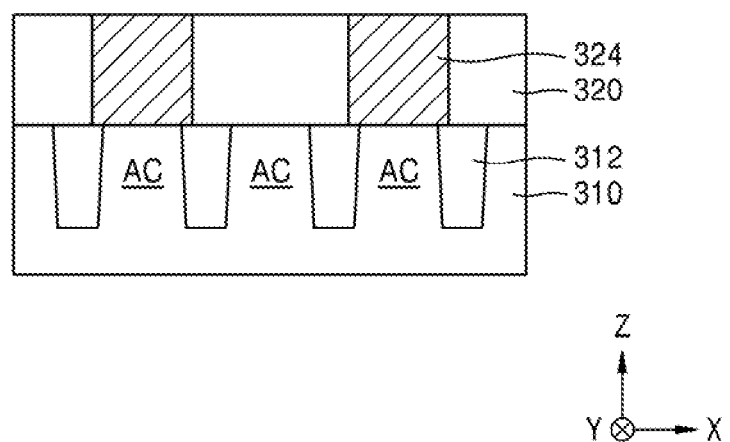
FIGS. 5A to 5J illustrate cross-sectional views of stages in a method of manufacturing an integrated circuit (IC) device according to embodiments.

Referring to FIG. 5A, an interlayer insulating film 320 may be formed on a substrate 310 including a plurality of active regions AC. Thereafter, a plurality of conductive regions 324 may be formed to pass through the interlayer insulating film 320 and be connected to a plurality of active regions AC.

The substrate 310 may include a semiconductor, e.g., silicon (Si) or germanium (Ge), or a compound semiconductor, such as silicon germanium (SiGe), silicon carbide (SiC), gallium arsenide (GaAs), indium arsenide (InAs), or indium phosphide (InP). The substrate 310 may include a conductive region, e.g., a doped well or a doped structure. The plurality of active regions AC may be defined by a plurality of device isolation regions 312 formed in the substrate 310. The device isolation region 312 may include a silicon oxide film, a silicon nitride film, a silicon oxynitride film, or a combination thereof. The interlayer insulating film 320 may include a silicon oxide film. The plurality of conductive regions 324 may be connected to one terminal of a switching element (not shown), such as a field-effect transistor (FET) formed on the substrate 310. The plurality of conductive regions 324 may include polysilicon, a metal, a conductive metal nitride, a metal silicide, or a combination thereof.

Figure 5B:
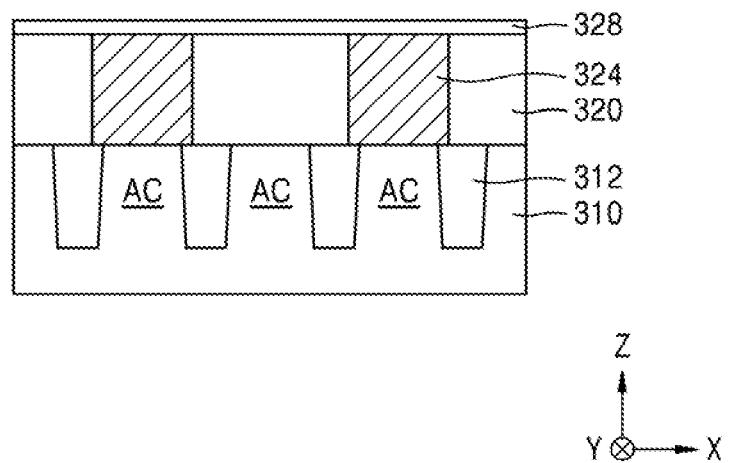

Referring to FIG. 5B, an insulating layer 328 may be formed to cover the interlayer insulating film 320 and the plurality of conductive regions 324. The insulating layer 328 may be used as an etch stop layer. The insulating layer 328 may include an insulating material having an etch selectivity with respect to the interlayer insulating film 320 and a mold film (refer to 330 in FIG. 5C) formed in a subsequent process. The insulating layer 328 may include silicon nitride, silicon oxynitride, or a combination thereof.

Figure 5C:
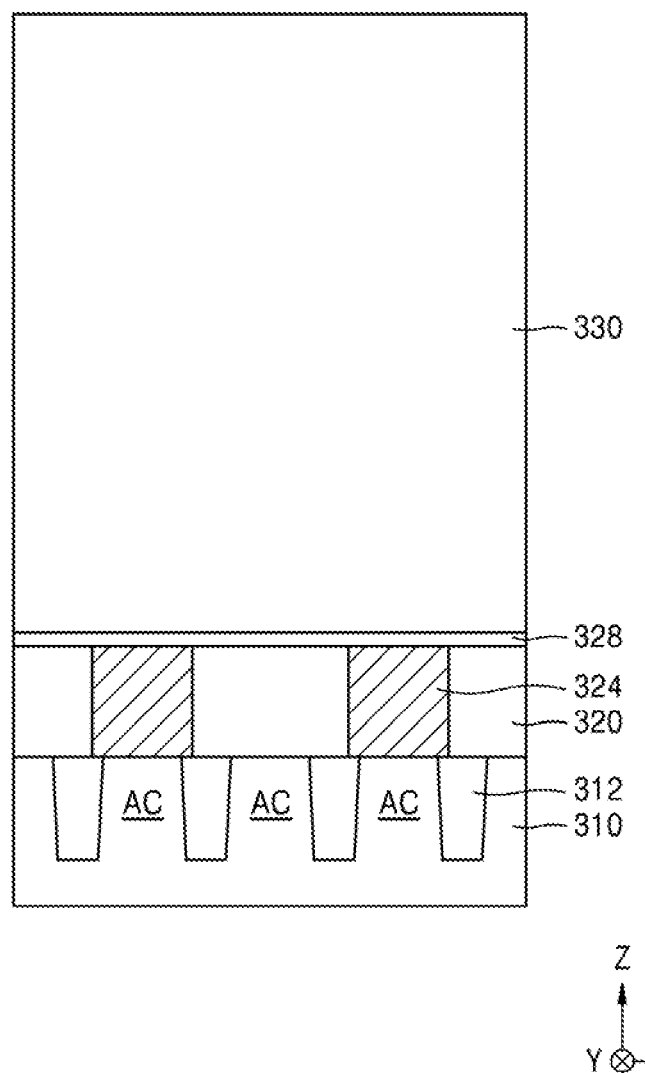

Referring to FIG. 5C, a mold film 330 may be formed on the insulating layer 328.

The mold film 330 may include an oxide film. For example, the mold film 330 may include an oxide film, such as boro phospho silicate glass (BPSG), phospho silicate glass (PSG), or undoped silicate glass (USG). The mold film 130 may be formed using a thermal CVD processor a plasma CVD process. In an implementation, the mold film 330 may be formed to a thickness of, e.g., about 1,000 Å to about 20,000 Å. In an implementation, the mold film 330 may include a support film. The support film may include a material having an etch selectivity with respect to the mold film 330. The support film may include a material having a relatively low etch rate for an etching atmosphere (e.g., an etchant including ammonium fluoride (NH$_4$F), hydrofluoric acid (HF), and water) used to remove the mold film 330 in a subsequent process. In an implementation, the support film may include silicon nitride, silicon carbonitride, tantalum oxide, titanium oxide, or a combination thereof.

Figure 5D:
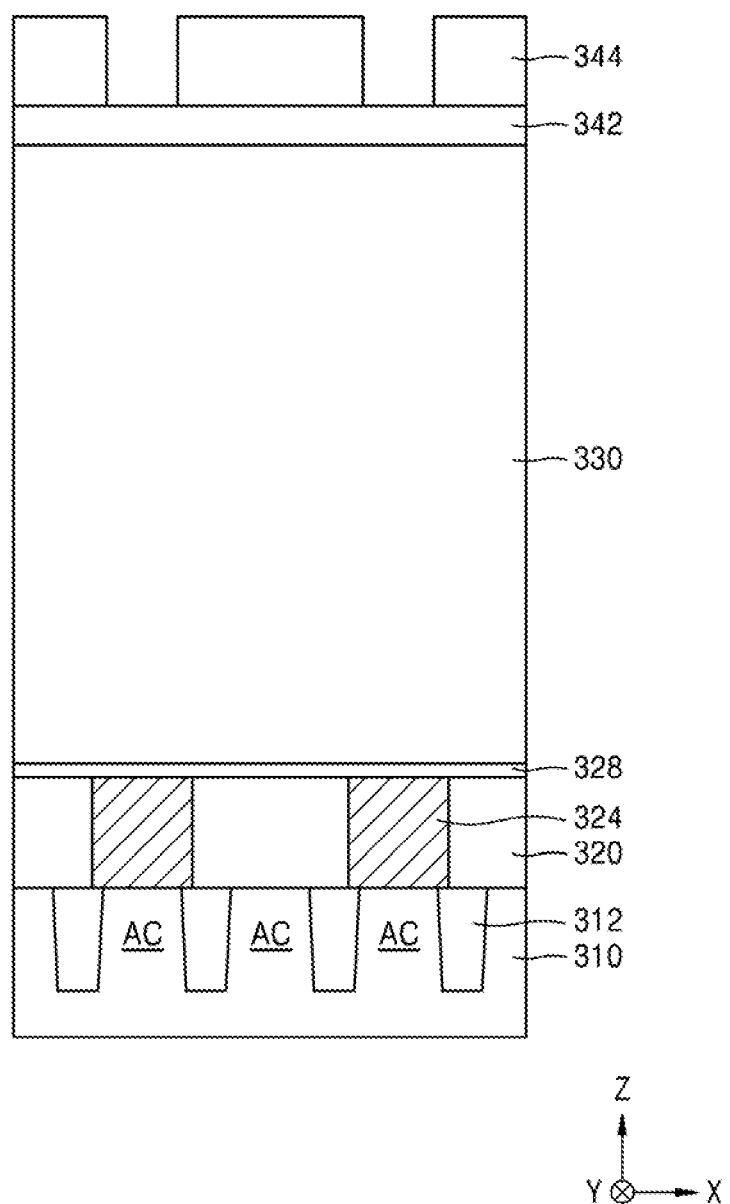

Referring to FIG. 5D, a sacrificial film 342 and a mask pattern 344 may be sequentially formed on the mold film 330.

The sacrificial film 342 may include an oxide film. The mask pattern 344 may include an oxide film, a nitride film, a polysilicon film, a photoresist film, or a combination thereof. A region where a lower electrode of a capacitor will be formed may be defined by the mask pattern 344.

Figure 5E:
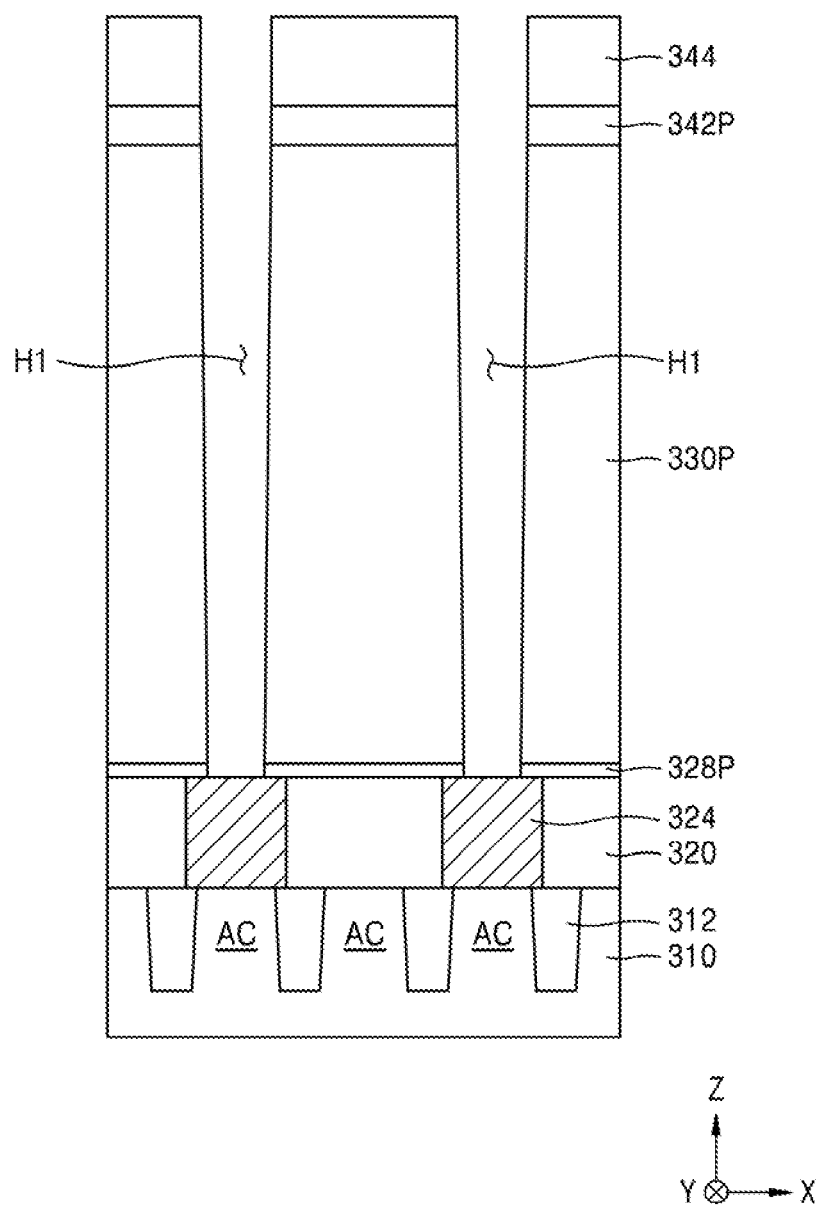

Referring to FIG. 5E, the sacrificial film 342 and the mold film 330 may be dry etched using the mask pattern 344 as an etch mask and using the insulating layer 328 as an etch stop layer, thereby forming a sacrificial pattern 342P and a mold pattern 330P to define a plurality of holes H1. In this case, the insulating layer 328 may also be etched due to an over etching process to form an insulating pattern 328P exposing a plurality of conductive regions 324.

Figure 5F:
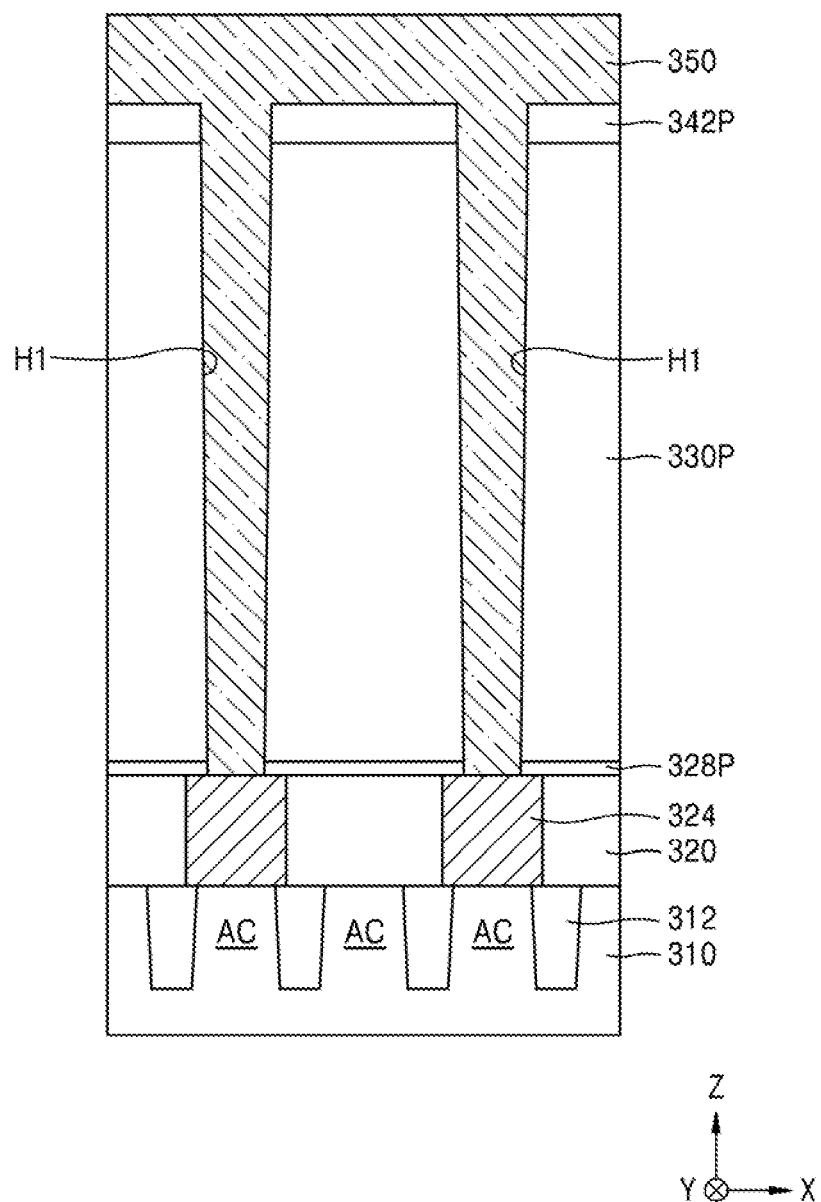

Referring to FIG. 5F, the mask pattern 344 may be removed from the resultant product of FIG. 5E, and a lower-electrode-forming conductive film 350 may be formed to fill the plurality of holes H1 and cover an exposed surface of the sacrificial pattern 342P.

The lower-electrode-forming conductive film 350 may include a doped semiconductor, a conductive metal nitride, a metal, a metal silicide, a conductive oxide, or a combination thereof. In an implementation, the lower-electrode-forming conductive film 350 may include a NbN film. In an implementation, the lower-electrode-forming conductive film 350 may include a combination of a NbN film and another conductive film. The other conductive film may include a doped semiconductor, a conductive metal nitride, a metal, a metal silicide, a conductive oxide, or a combination thereof. For example, the lower-electrode-forming conductive film 350 may include NbN, TiN, TiAlN, TaN, TaAlN, W, WN, Ru, $RuO_2$, $SrRuO_3$, Ir, $IrO_2$, Pt, PtO, SRO($SrRuO_3$), BSRO($(Ba,Sr)RuO_3$), CRO($CaRuO_3$), LSCo (($La,Sr)CoO_3$), or a combination thereof.

To form a NbN film for the formation of the lower-electrode-forming conductive film 350, the above-described method of forming the thin film may be used. For example, according to the method of forming the thin film, which is described with reference to FIG. 1, FIG. 3, or FIG. 4, a CVD process or an ALD process may be performed using a niobium precursor composition including the niobium compound of General formula I and a reactive gas including N atoms. In an implementation, a niobium compound having a structure selected out of Formulae 1 to 36 may be used as the niobium compound, and $NH_3$ may be used as the reactive gas. The lower-electrode-forming conductive film 350 may be formed using a CVD process, a metal organic CVD (MOCVD) process, or an ALD process.

Figure 5G:
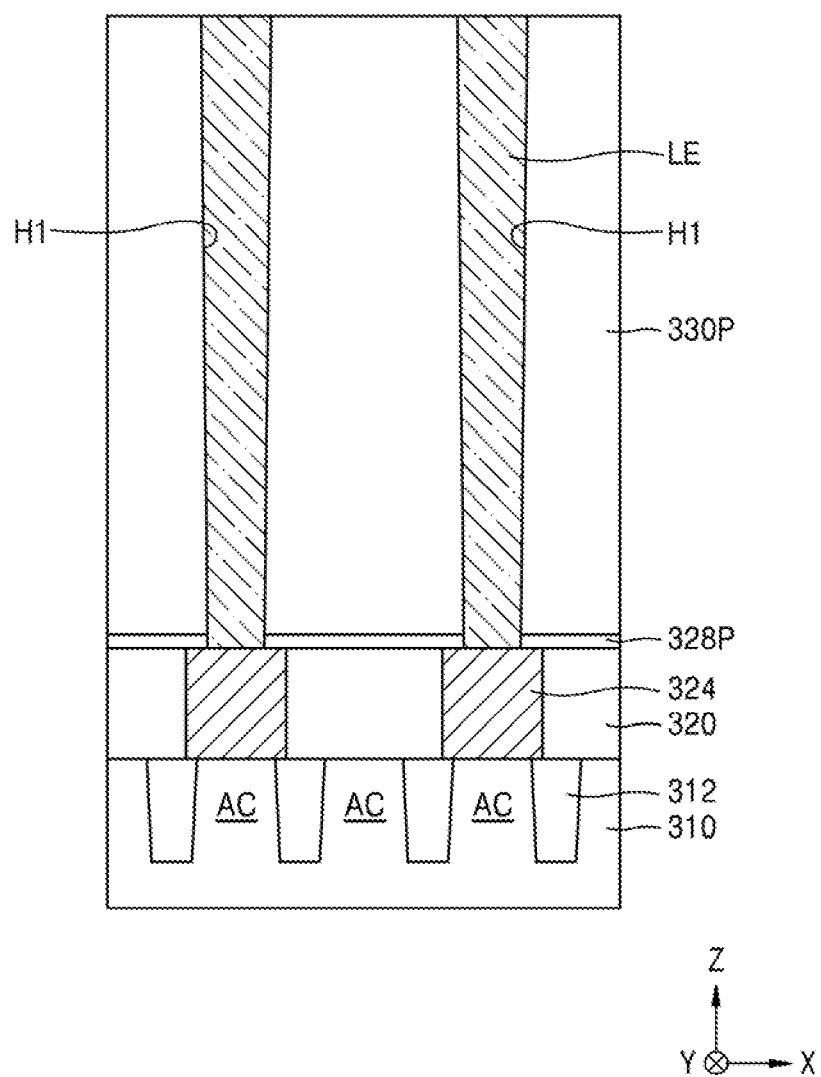

Referring to FIG. 5G, an upper portion of the lower-electrode-forming conductive film 350 may be partially removed to form a plurality of lower electrodes LE from the lower-electrode-forming conductive film 350.

To form the plurality of lower electrodes LE, the upper portion of the lower-electrode-forming conductive film 350 and the sacrificial pattern (refer to 342P in FIG. 5F) may be removed using an etch back process or a chemical mechanical polishing (CMP) process until a top surface of the mold pattern 330P is exposed.

Figure 5H:
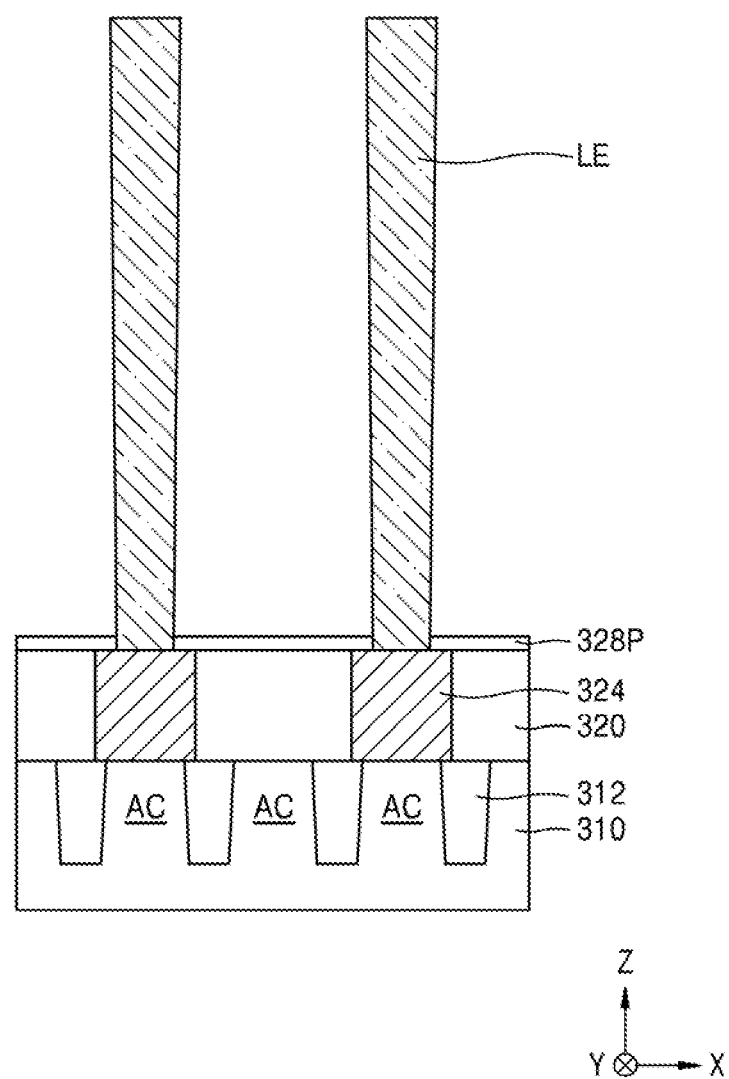

Referring to FIG. 5H, the mold pattern 330P may be removed from the resultant product of FIG. 5G to expose outer surfaces of the plurality of lower electrodes LE. The mold pattern 330P may be removed by a lift-off process using an etchant including ammonium fluoride ($NH_4F$), hydrofluoric acid (HF), and water.

Figure 5I:
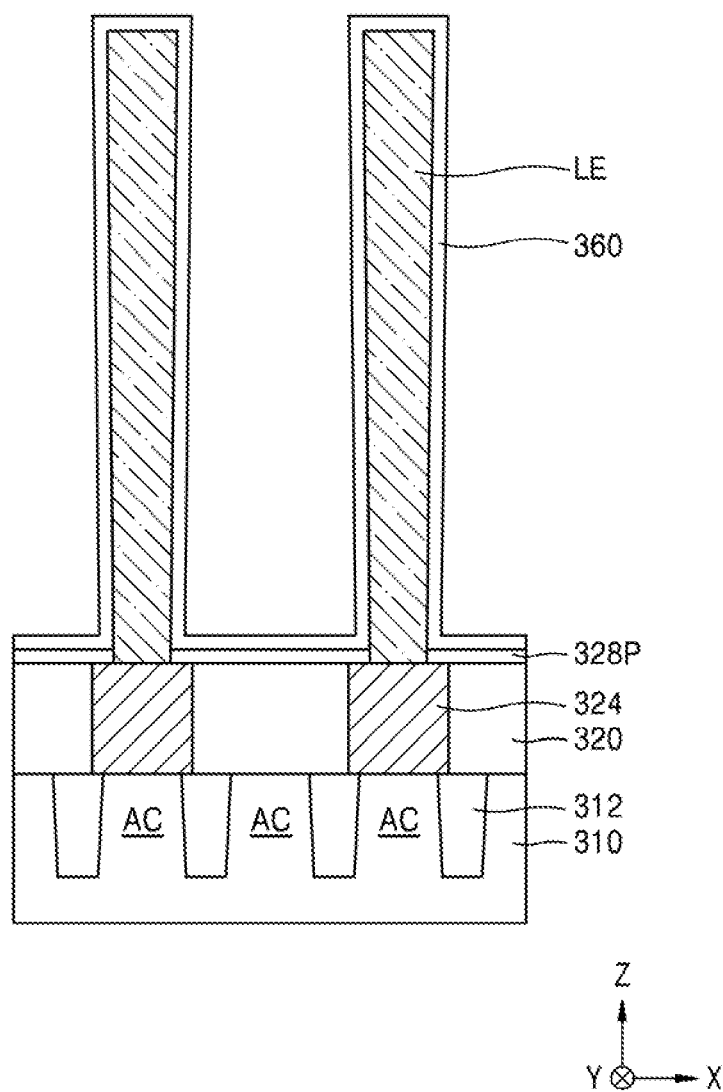

Referring to FIG. 5I, a dielectric film 360 may be formed on the plurality of lower electrodes LE.

The dielectric film 360 may be formed to conformally cover the exposed surfaces of the plurality of lower electrodes LE. The dielectric film 360 may include oxide, a metal oxide, nitride, or a combination thereof. In an implementation, the dielectric film 360 may include a high-k dielectric film having a higher dielectric constant than silicon oxide. In an implementation, the dielectric film 360 may include a niobium oxide film. For example, the dielectric film 360 may include a NbO film, a $NbO_2$ film, or a $Nb_2O_5$ film. The dielectric film 360 may include a niobium oxide film alone or a multilayered structure including a combination of at least one niobium oxide film and at least one of other high-k dielectric films. In an implementation, the other high-k dielectric films may include, e.g., hafnium oxide, hafnium oxynitride, hafnium silicon oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof.

To form the dielectric film 360, the method of forming the thin film, which is described with reference to FIG. 1, 3, or 4, may be used. In an implementation, the dielectric film 360 may be formed using an ALD process. In an implementation, the dielectric film 360 may have a thickness of, e.g., about 50 Å to about 150 Å.

Figure 5J:
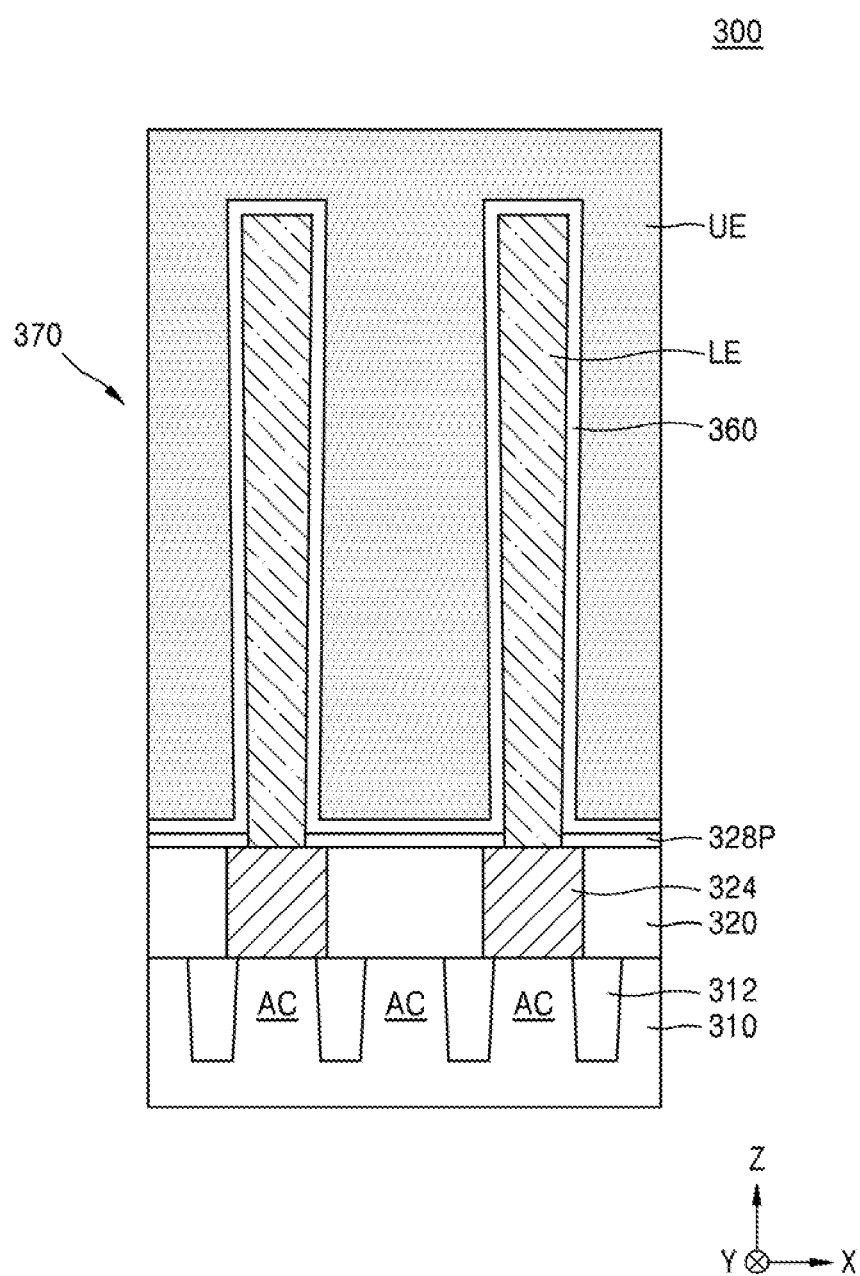

Referring to FIG. 5J, an upper electrode UE may be formed on the dielectric film 360. The lower electrode LE, the dielectric film 360, and the upper electrode UE may constitute a capacitor 370.

The upper electrode UE may include a doped semiconductor, a conductive metal nitride, a metal, a metal silicide, a conductive oxide, or a combination thereof. In an implementation, the upper electrode UE may include, e.g., TiN, TiAlN, TaN, TaAlN, W, WN, Ru, $RuO_2$, $SrRuO_3$, Ir, $IrO_2$, Pt, PtO, SRO ($SrRuO_3$), BSRO (($Ba,Sr)RuO_3$), CRO ($CaRuO_3$), LSCo (($La,Sr)CoO_3$), or a combination thereof. The upper electrode UE may be formed using a CVD process, a MOCVD process, a physical vapor deposition (PVD) process, or an ALD process.

In an implementation, in the method of manufacturing the IC device illustrated in FIGS. 5A to 5J, each of the plurality of lower electrodes LE may have a pillar shape. In an implementation, each of the lower electrodes LE may have a cup-shaped sectional structure or a cylindrical sectional structure with a blocked bottom portion.

In the IC device 300 manufactured by using the method described with reference to FIGS. 5A to 5J, the capacitor 370 may include the lower electrodes LE having a 3D electrode structure. In order to compensate for a capacitance reduction due to a reduction in design rule, an aspect ratio of the lower electrode LE having a 3D structure is increasing, and an ALD process may be used to form the dielectric film 360 having a good quality in a deep, narrow 3D space. In the method of manufacturing the IC device according to the embodiments, which is described with reference to FIGS. 5A to 5J, the lower electrodes LE or the dielectric film 360 may be formed using the niobium compound of General formula 1, according to the embodiment and thus, process stability may be improved.

Figure 6A:
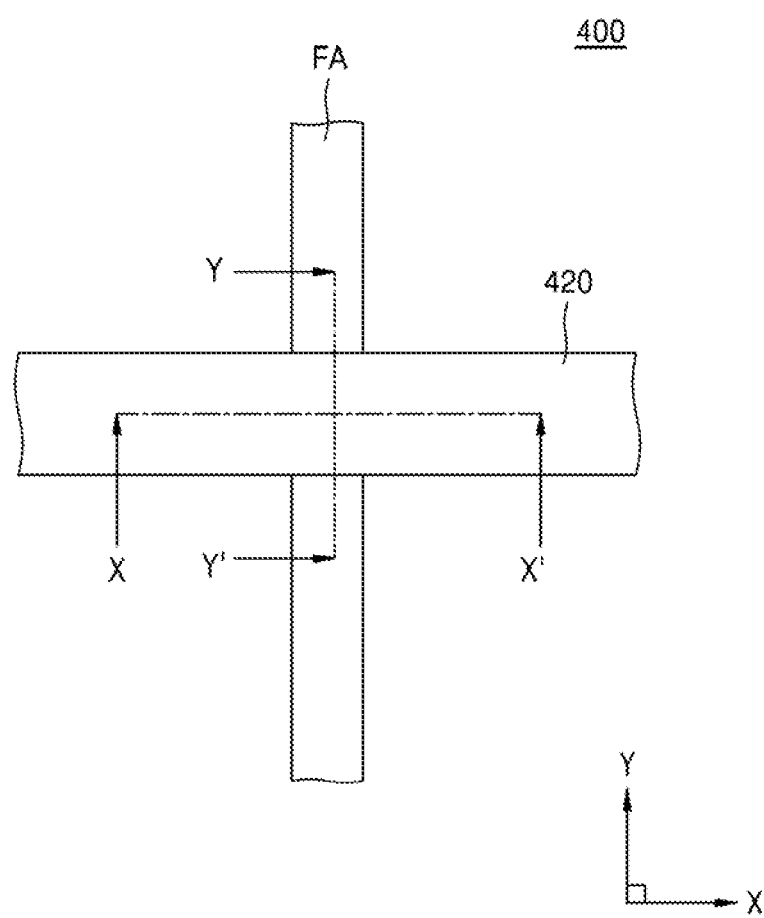
Figure 6B:
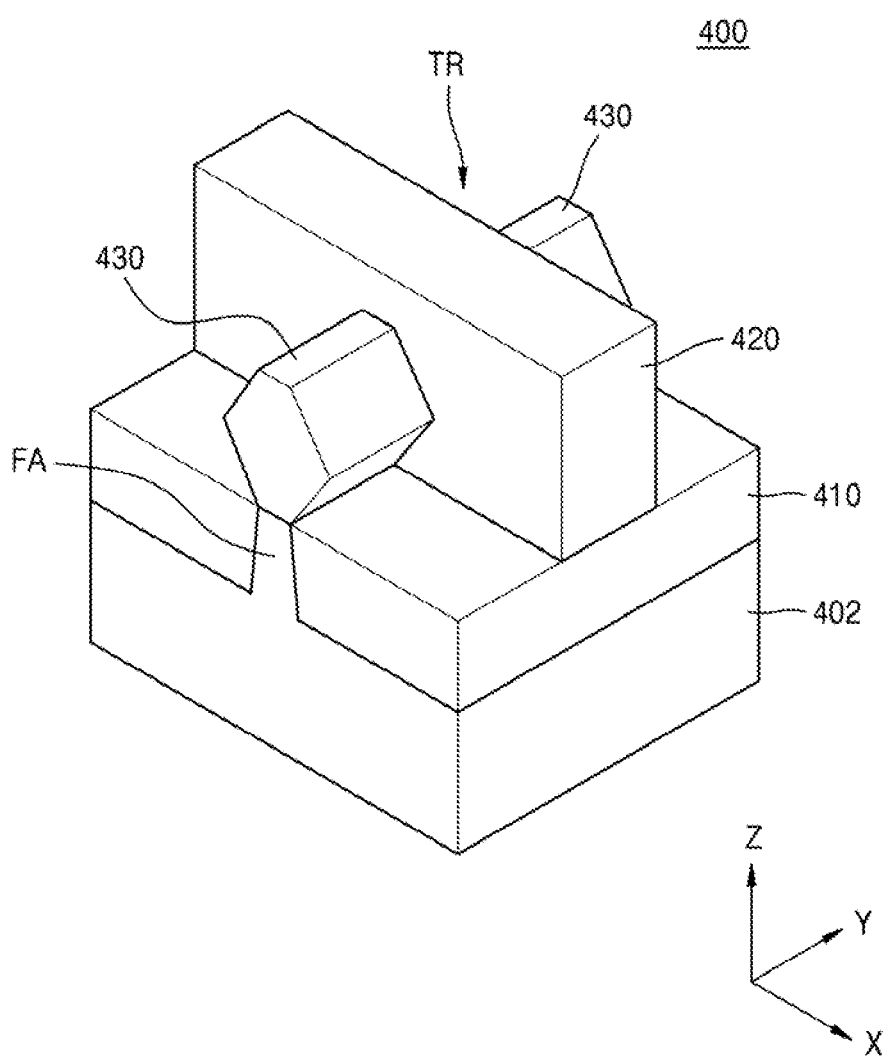
Figure 6C:
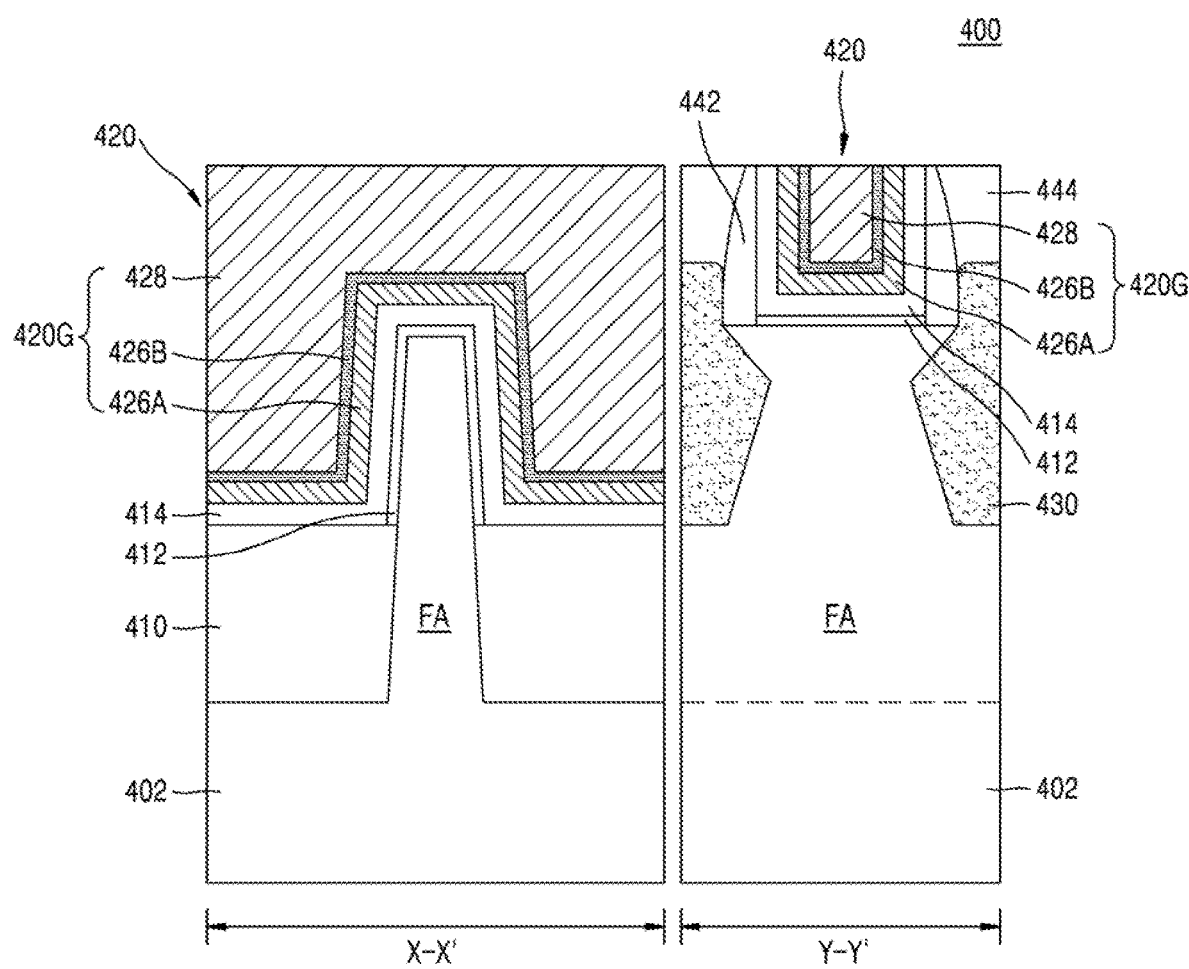

FIGS. 6A to 6C illustrate stages in a method of manufacturing an IC device 400 according to embodiments. FIG.

6A is a plan view of the IC device 400 to be formed. FIG. 6B is a perspective view of the IC device 400 of FIG. 6A. FIG. 6C is a cross-sectional view of sectional configurations taken along lines X-X' and Y-Y' of FIG. 6A.

Referring to FIGS. 6A to 6C, the IC device 400 may include a fin-type active region FA, which protrudes from a substrate 402.

The substrate 402 may include a semiconductor, such as Si or Ge, or a compound semiconductor, such as SiGe, SiC, GaAs, InAs, or InP. A device isolation film 410 may be formed on the substrate 402 to cover a lower side wall of the fin-type active region FA. The fin-type active region FA may protrude as a fin type over the device isolation film 410. The fin-type active region FA may extend long in one direction (or Y direction). The device isolation film 410 may include a silicon oxide film, a silicon nitride film, a silicon oxynitride film, or a combination thereof.

A gate structure 420 may be formed over the substrate 402 and extend on the fin-type active region FA in a direction (X direction), which intersects with a direction in which the fin-type active region FA extends. One pair of source/drain regions 430 may be formed in the fin-type active region FA on both sides of the gate structure 420. The pair of source/drain regions 430 may include a semiconductor layer that is epitaxially grown from the fin-type active region FA. Each of the pair of source/drain regions 430 may include an embedded SiGe structure including a plurality of epitaxially grown SiGe layers, an epitaxially grown Si layer, or an epitaxially grown SiC layer. In an implementation, as illustrated in FIG. 6B, each of one pair of source/drain regions 430 may have a hexagonal sectional shape. In an implementation, each of the pair of source/drain regions 430 may have various sectional shapes, e.g., a circular shape, an elliptical shape, and a polygonal shape.

A MOS transistor TR may be formed at an intersection between the fin-type active region FA and the gate structure 420. The MOS transistor TR may be implemented as a 3D MOS transistor in which a channel is formed on a top surface and both side surfaces of the fin-type active region FA. The MOS transistor TR may constitute an NMOS transistor or a PMOS transistor.

As shown in FIG. 6C, the gate structure 420 may include an interface layer 412, a high-k dielectric film 414, a first metal-containing layer 426A, a second metal-containing layer 426B, and a gap-fill metal layer 428, which are sequentially formed on a surface of the fin-type active region FA. The first metal-containing layer 426A, the second metal-containing layer 426B, and the gap-fill metal layer 428 may constitute a gate electrode 420G.

Insulating spacers 442 may be formed on both side surfaces of the gate structure 420. The insulating spacers 442 and the pair of source/drain regions 430 may be covered by an interlayer insulating film 444.

An interface layer 412 may be formed on the surface of the fin-type active region FA. The interface layer 412 may include an insulating material, such as an oxide film, a nitride film, or an oxynitride film. The interface layer 412 and the high-k dielectric film 414 may constitute a gate insulating film. The high-k dielectric film 414 may include a material having a higher dielectric constant than a silicon oxide film. For example, the high-k dielectric film 414 may include a niobium oxide film. For example, the high-k dielectric film 414 may include a NbO film, a $NbO_2$ film, or a $Nb_2O_5$ film. The high-k dielectric film 414 may include a niobium oxide film alone or a multilayered structure including a combination of at least one niobium oxide film and at least one of other high-k dielectric films. In an implementation, the high-k dielectric film 414 may include, e.g., hafnium oxide, hafnium oxynitride, hafnium silicon oxide, zirconium oxide, zirconium silicon oxide, tantalum oxide, titanium oxide, bariumstrontiumtitaniumoxide, bariumtitanium oxide, strontiumtitaniumoxide, yttrium oxide, aluminum oxide, lead scandiumtantalum oxide, lead zinc niobate, or a combination thereof.

The first metal-containing layer 426A may include titanium nitride, tantalum nitride, titanium oxynitride, or tantalum oxynitride. For example, the first metal-containing layer 426A may include titanium nitride (TiN), tantalum nitride (TaN), titanium aluminum nitride (TiAlN), tantalum aluminum nitride (TaAlN), titanium silicon nitride (TiSiN), or a combination thereof. The first metal-containing layer 426A may be formed using various deposition methods, such as an ALD process, a CVD process, and a PVD process. The second metal-containing layer 426B, together with the first metal-containing layer 426A, may serve to adjust a work function of the gate structure 420. A threshold voltage of the gate structure 420 may be adjusted by adjusting the work function using the first metal-containing layer 426A and the second metal-containing layer 426B. In an implementation, the second metal-containing layer 426B may include an N-type metal-containing layer required for an NMOS transistor including an aluminum (Al) compound containing titanium (Ti) or tantalum (Ta). In an implementation, the second metal-containing layer 426B may include titanium aluminum carbide (TiAlC), titanium aluminum nitride (TiAlN), titanium aluminum carbonitride (TiAlCN), titanium aluminide (TiAl), tantalum aluminum carbide (TaAlC), tantalum aluminum nitride (TaAlN), tantalum aluminum carbonitride (TaAlCN), tantalum aluminide (TaAl), or a combination thereof. In an implementation, the second metal-containing layer 426B may include a P-type metal-containing layer required for a PMOS transistor. In an implementation, the second metal-containing layer 426B may include at least one of molybdenum (Mo), palladium (Pd), ruthenium (Ru), platinum (Pt), titanium nitride (TiN), tungsten nitride (WN), tantalum nitride (TaN), iridium (Ir), tantalum carbide (TaC), ruthenium nitride (RuN), or molybdenum nitride (MoN). The second metal-containing layer 426B may include a single layer or a multilayered structure. The gap-fill metal layer 428 may include tungsten (W), a conductive metal nitride (e.g., TiN and TaN), aluminum (Al), a metal carbide, a metal silicide, a metal aluminum carbide, a metal aluminum nitride, a metal silicon nitride, or a combination thereof.

FIGS. 7A to 7F illustrate cross-sectional views of stages in a method of manufacturing the IC device 400 shown in FIGS. 6A to 6C, according to an embodiment. FIGS. 7A to 7F illustrate cross-sectional configurations of portions taken along lines X-X' and Y-Y' of FIG. 6A. In FIGS. 7A to 7F, the same reference numerals are used to denote the same elements as in FIGS. 6A to 6C, and a repeated detailed description thereof may be omitted.

Figure 7A:
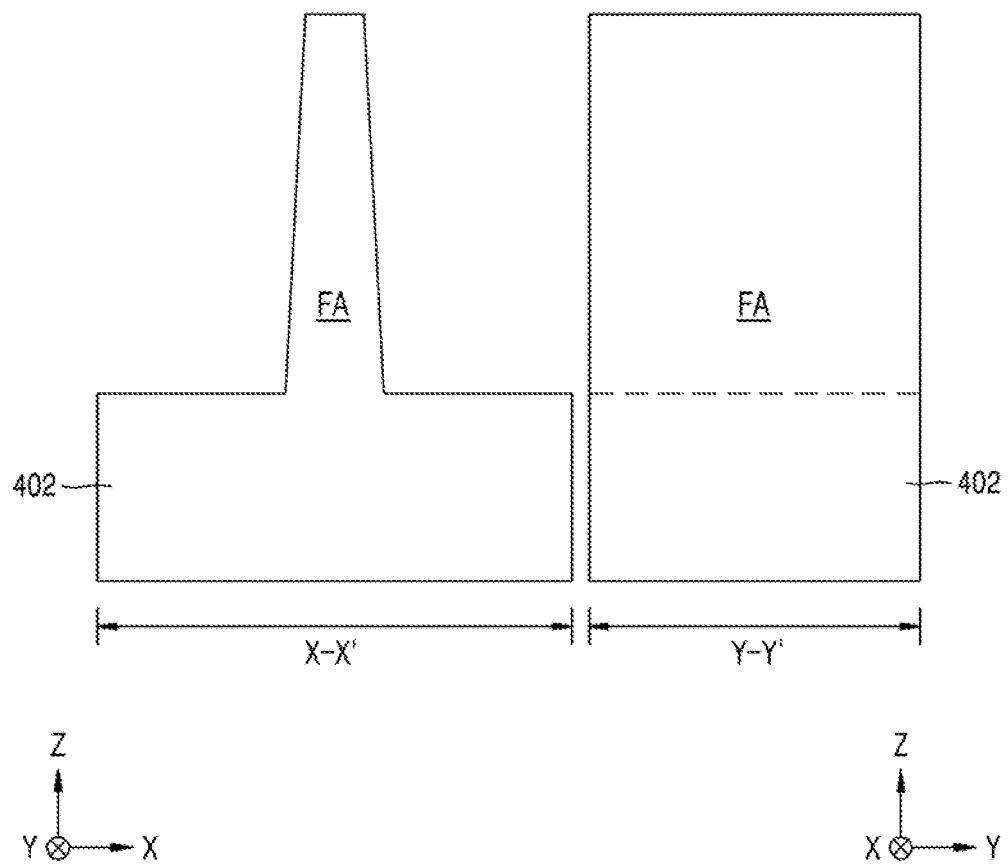
FIGS. 7A to 7F illustrate cross-sectional views of stages in a method of manufacturing the IC device shown in FIGS. 6A to 6C, according to an embodiment.

Referring to FIG. 7A, an upper portion of a substrate 402 may be partially etched to form a fin-type active region FA.

Figure 7B:
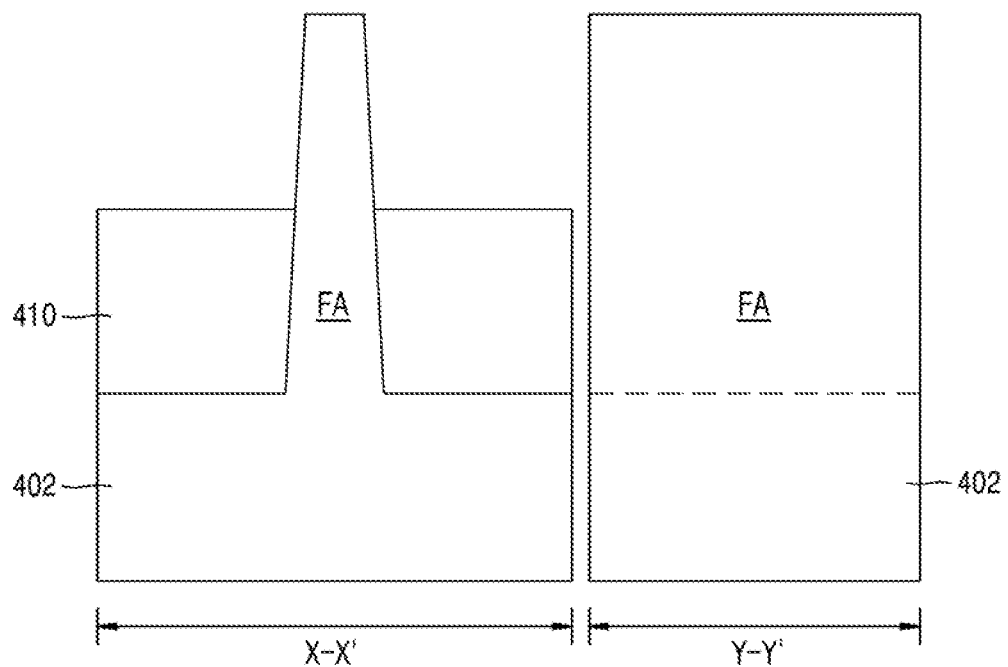

Referring to FIG. 7B, a device isolation film 410 may be formed to cover both side walls of a lower portion of the fin-type active region FA. After the device isolation film 410 is formed, an upper portion of the fin-type active region FA may protrude over the device isolation film 410.

Figure 7C:
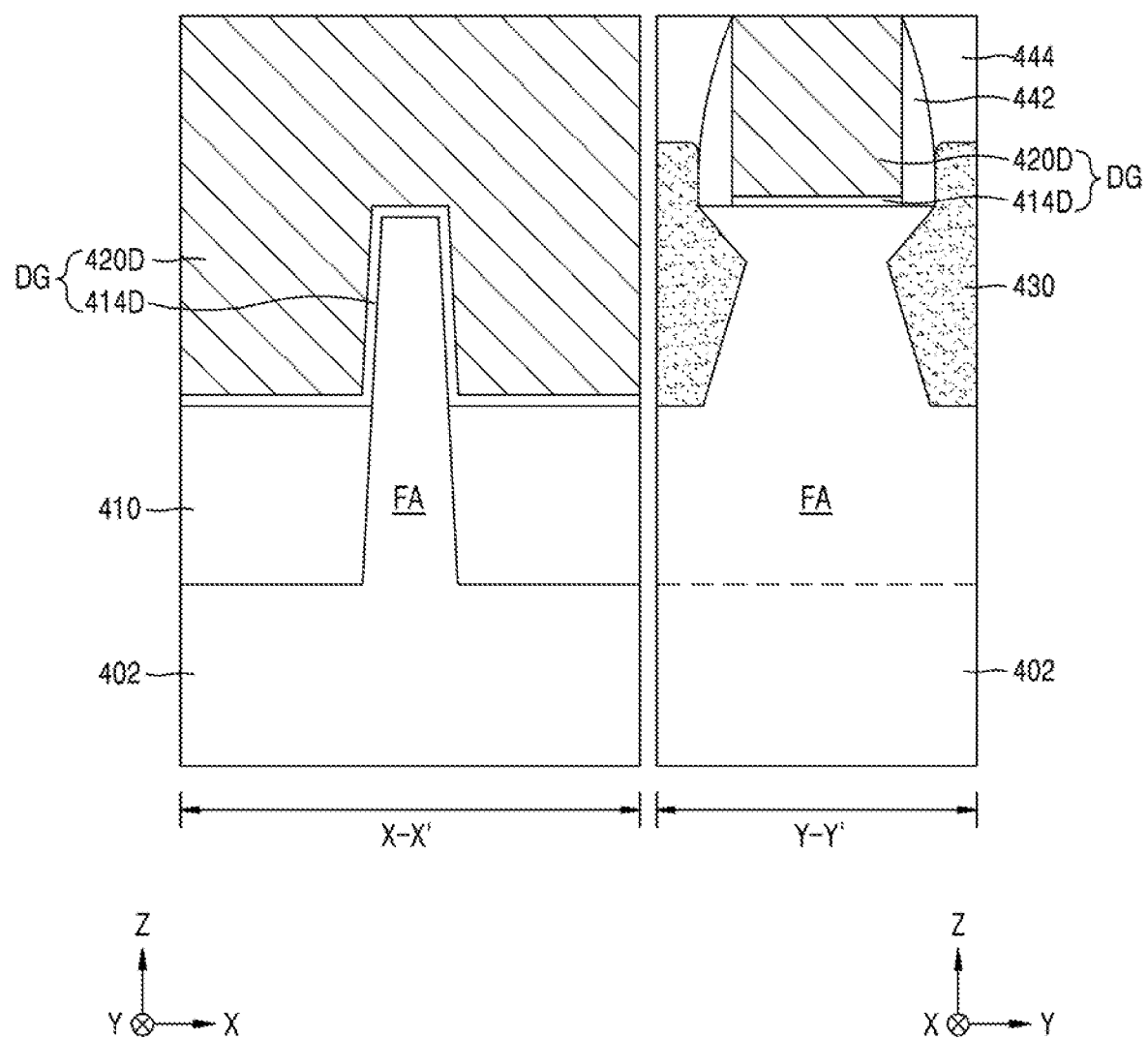

Referring to FIG. 7C, a dummy gate structure DG including a dummy gate insulating film 414D and a dummy gate electrode 420D may be formed on the fin-type active region FA. Both side walls of the dummy gate structure DG may be covered by insulating spacers 442. Source/drain regions 430 may be respectively formed in the fin-type active region FA on both sides of the dummy gate structure DG. An interlayer insulating film 444 may be formed on both sides of the dummy gate structure DG to cover the source/drain regions 430. The dummy gate structure DG may be formed to extend in a direction (X direction), which intersects with a direction in which the fin-type active region FA extends.

The dummy gate insulating film 414D may include a silicon oxide film, the dummy gate electrode 420D may include polysilicon, and the insulating spacers 442 may include a silicon nitride film. The interlayer insulating film 444 may include a silicon oxide film, a silicon nitride film, or a combination thereof.

Figure 7D:
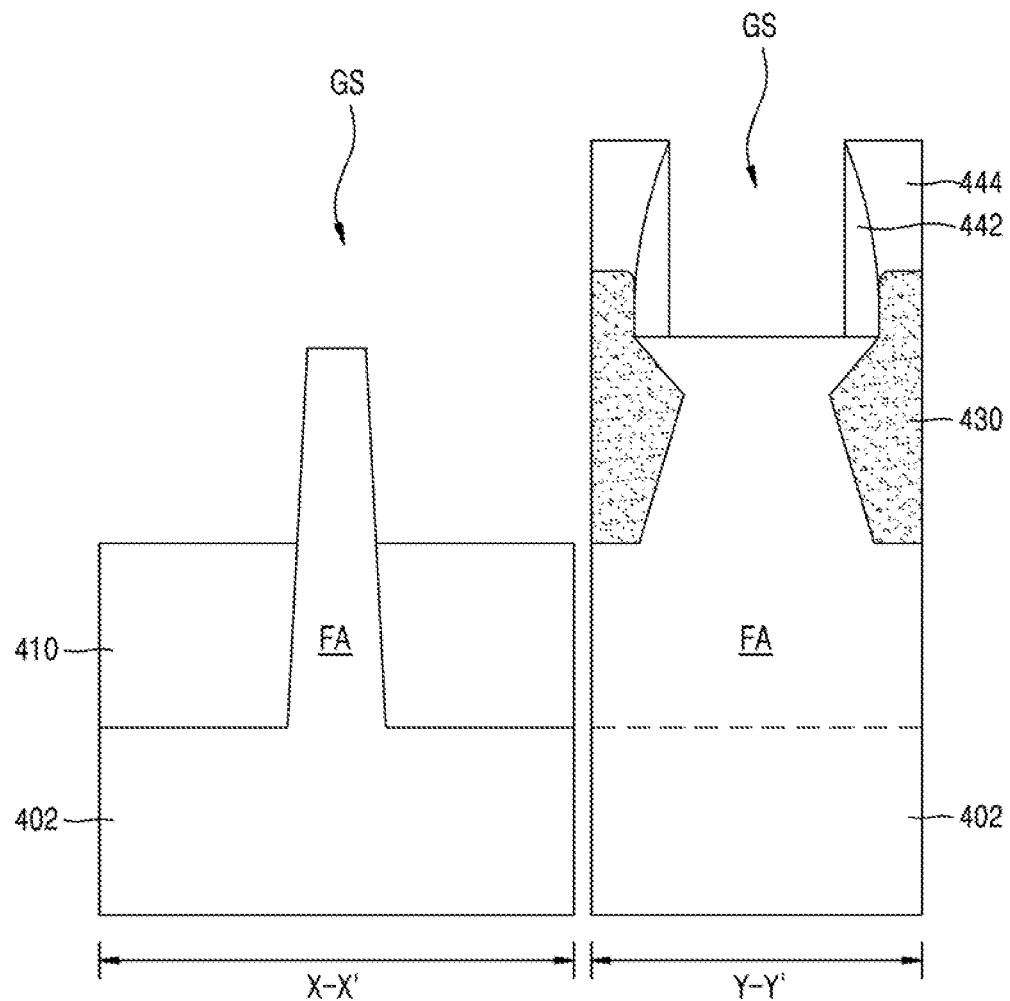

Referring to FIG. 7D, the dummy gate structure DG, which is exposed by the interlayer insulating film 444, may be removed to expose the fin-type active region FA through a gate space GS between a pair of insulating spacers 442.

Figure 7E:
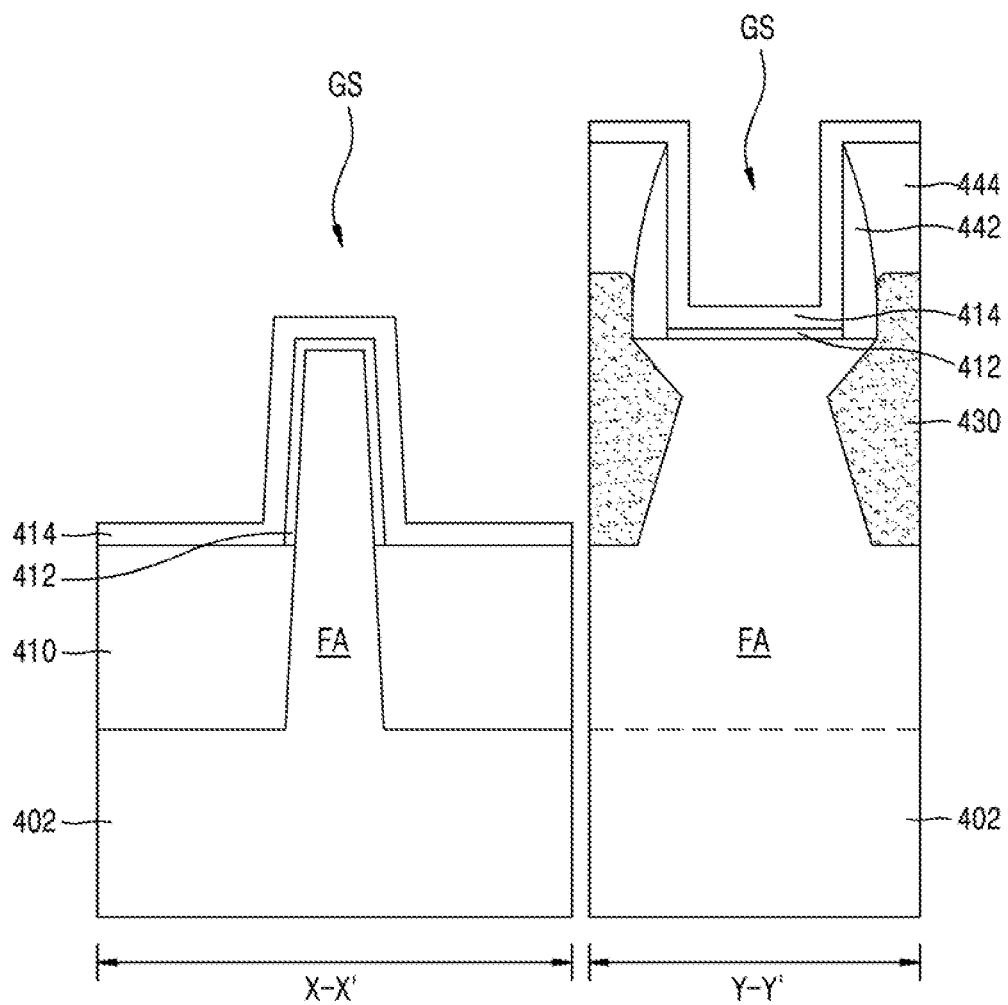

Referring to FIG. 7E, an interface layer 412 and a high-k dielectric film 414 may be sequentially formed on a surface of the fin-type active region FA, which is exposed through the gate space GS.

The high-k dielectric film 414 may be formed using the method of forming the thin film, which is described with reference to FIG. 1, 3, or 4. In an implementation, the high-k dielectric film 414 may be formed using an ALD process.

Figure 7F:
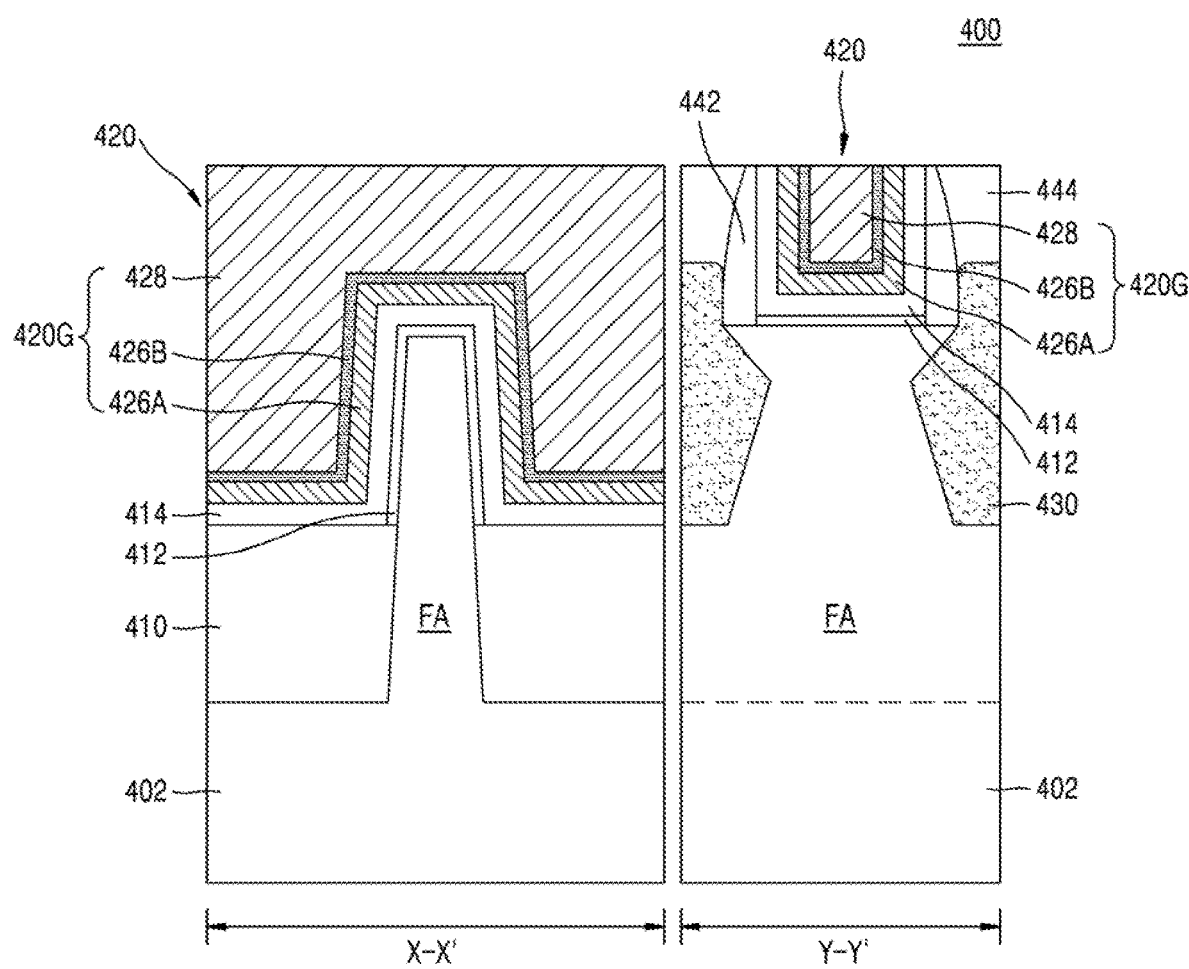

Referring to FIG. 7F, a first metal-containing layer 426A, a second metal-containing layer 426B, and a gap-fill metal layer 428 may be sequentially formed on the high-k dielectric film 414, and a planarization process may be performed until a top surface of the interlayer insulating film 444 is exposed. For example, the IC device 400 shown in FIGS. 6A to 6C may be manufactured.

In the method of manufacturing the IC device 400, which is described with reference to FIGS. 7A to 7F, the high-k dielectric film 414 may be formed by an ALD process using a niobium compound of General formula I as a precursor. The niobium compound of General formula I may provide characteristics suitable for a source compound for the ALD process, e.g., a low melting point, a high vapor pressure, transportability in a liquid phase, vaporization easiness, and high thermal stability. Accordingly, the process of forming the high-k dielectric film 414 may be stably performed using the niobium compound of General formula I.

In an implementation, various IC devices may be manufactured by a deposition process using the niobium compound of General formula I as a precursor. For example, various IC devices, such as a vertical NAND (V-NAND) flash memory device including a tunneling dielectric film formed using the niobium compound of General formula I as a precursor and a DRAM device, a magnetoresistive RAM (MRAM) device, or a phase-change RAM (PRAM) device, which includes a gate dielectric film formed using the niobium compound of General formula I as a precursor, may be manufactured.

By way of summation and review, forming niobium-containing thin films having good gap-fill characteristics and good step coverage characteristics in narrow, deep spaces having high aspect ratios has been considered. Also, integrated circuit (IC) devices having high operating speed and high reliability have been considered.

One or more embodiments may provide a niobium compound, which may have characteristics appropriate for a source compound for forming a niobium-containing film and may provide excellent process stability and mass productivity.

One or more embodiments may provide a method of forming a thin film, which may provide desired electrical characteristics using a niobium compound capable of providing excellent process stability and mass productivity.

One or more embodiments may provide a niobium compound having a cyclopentadienyl group.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A niobium compound represented by the following General formula I:

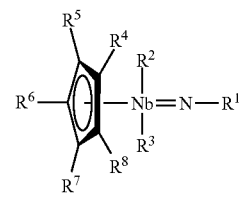

[General formula I]

wherein, in General formula I,
$R^1$, $R^4$, $R^5$, $R^6$, $R^7$, and $R^8$ are each independently a hydrogen atom, a C1-C6 linear or branched alkyl group or a C3-C6 cyclic hydrocarbon group, at least one of $R^4$, $R^5$, $R^6$, $R^7$, and $R^8$ being a C1-C6 linear or branched alkyl group and at least one of $R^4$, $R^5$, $R^6$, $R^7$, and $R^8$ being a hydrogen atom, and
$R_2$ and $R_3$ are each independently a hydrogen, a halogen atom, a C1-C6 linear or branched alkyl group, or a C3-C6 cyclic hydrocarbon group.

2. The niobium compound as claimed in claim 1, wherein:
one of $R^4$, $R^5$, $R^6$, $R^7$, and $R^8$ is a C1-C3 linear alkyl group or a C3 branched alkyl group, and
remaining ones of $R^4$, $R^5$, $R^6$, $R^7$, and $R^8$ are hydrogen atoms.

3. The niobium compound as claimed in claim 1, wherein $R^1$ is a C1-C5 linear or branched alkyl group.

4. The niobium compound as claimed in claim 1, wherein at least one of $R^2$ and $R^3$ is a halogen atom.

5. The niobium compound as claimed in claim 1, wherein at least one of $R^2$ and $R^3$ is a C1-C3 linear alkyl group or a C3 branched alkyl group.

6. The niobium compound as claimed in claim 1, wherein: the niobium compound is represented by the following General formula II:

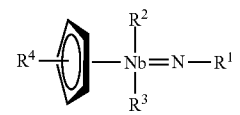

[General formula II]

in General formula II,

R$^1$ and R$^4$ are each independently a C1-C6 linear or branched alkyl group, and R$^2$ and R$^3$ are each independently a halogen atom or a C1-C6 linear or branched alkyl group.

7. The niobium compound as claimed in claim 6, wherein R$^1$ is a C3-C5 branched alkyl group.

8. The niobium compound as claimed in claim 6, wherein R$^2$ and R$^3$ are each independently a halogen atom.

9. The niobium compound as claimed in claim 6, wherein R$^2$ and R$^3$ are each independently a C1-C3 linear alkyl group or a C3 branched alkyl group.

10. The niobium compound as claimed in claim 6, wherein R$^4$ is a C1-C3 linear alkyl group or a C3 branched alkyl group.

11. The niobium compound as claimed in claim 6, wherein:

R$^1$ is a branched pentyl group,

R$^2$ and R$^3$ are each independently a chlorine atom, a C1-C3 linear alkyl group, or a C3 branched alkyl group, and R$^4$ is a C1-C3 linear alkyl group or a C3 branched alkyl group.

12. A niobium compound represented by the following General formula I:

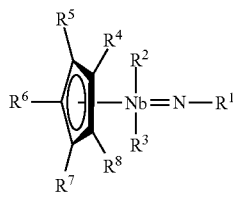

[General formula I]

wherein, in General formula I,

R$^1$ is a C1-C6 linear or branched alkyl group or a C3-C6 cyclic hydrocarbon group, R$^2$ and R$^3$ are each independently a hydrogen atom, a halogen atom, a C1-C6 linear or branched alkyl group, or a C3-C6 cyclic hydrocarbon group, one of R$^4$, R$^5$, R$^6$, R$^7$, and R$^8$ is a C1-C3 linear alkyl group or a C3 branched alkyl group, and remaining ones of R$^4$, R$^5$, R$^6$, R$^7$, and R$^8$ are hydrogen atoms.

13. The niobium compound as claimed in claim 12, wherein R$^1$ is a C3-C5 linear or branched alkyl group.

14. The niobium compound as claimed in claim 12, wherein R$^2$ and R$^3$ are each independently a chlorine atom, a C1-C3 linear alkyl group, or a C3 branched alkyl group.

15. A niobium compound represented by the following General formula II:

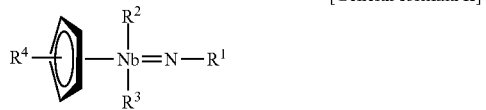

[General formula II]

wherein, in General formula II,

R$^1$ and R$^4$ are each independently a C1-C6 linear or branched alkyl group, and R$^2$ and R$^3$ are each independently a halogen atom or a C1-C6 linear or branched alkyl group.

16. The niobium compound as claimed in claim 15, wherein:

R$^1$ is a tert-pentyl group, an isopentyl group, or a neopentyl group,

R$^2$ and R$^3$ are the same group and are a chlorine atom, a C1-C3 linear alkyl group, or a C3 branched alkyl group, and R$^4$ is a C1-C3 linear alkyl group or a C3 branched alkyl group.

17. The niobium compound as claimed in claim 15, wherein the niobium compound is a liquid at about 20° C. to about 28° C.

* * * * *